(12) United States Patent
Ezaki et al.

(10) Patent No.: US 7,244,629 B2
(45) Date of Patent: Jul. 17, 2007

(54) VERTICAL CAVITY SURFACE EMITTING LASER DIODE AND METHOD FOR MANUFACTURING THE SAME

(75) Inventors: Mizunori Ezaki, Kanagawa-ken (JP); Michihiko Nishigaki, Kanagawa-ken (JP); Keiji Takaoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 10/978,346

(22) Filed: Nov. 2, 2004

(65) Prior Publication Data
US 2005/0121678 A1 Jun. 9, 2005

(51) Int. Cl.
*H01L 21/00* (2006.01)
*H01L 31/00* (2006.01)
*H01S 5/00* (2006.01)

(52) U.S. Cl. ............. 438/39; 257/E33.011; 372/46.013

(58) Field of Classification Search ................. 438/39; 257/183, E33.011, E33.012; 372/46.013
See application file for complete search history.

(56) References Cited

U.S. PATENT DOCUMENTS

| 5,189,549 A | 2/1993 | Leventis et al. |
| 5,444,330 A | 8/1995 | Leventis et al. |
| 5,493,577 A | 2/1996 | Choquette et al. |
| 6,014,400 A | 1/2000 | Kobayashi |
| 6,678,307 B2 | 1/2004 | Ezaki et al. |
| 6,898,226 B2 * | 5/2005 | Otoma et al. ............ 372/46.01 |
| 2002/0109149 A1 * | 8/2002 | Chang ......................... 257/98 |

FOREIGN PATENT DOCUMENTS

| JP | 9-266350 | 10/1997 |
| JP | 10-125999 | 5/1998 |
| JP | 11-054838 | 2/1999 |
| JP | 2001-160658 | 6/2001 |

OTHER PUBLICATIONS

F. Monti di Sopra et al., "Polarization Control in Strained T-bar VCSELs", IEEE Photonics Technology Letters, vol. 14, No. 8, Aug. 2002, pp. 1034-1036.
Kent D. Choquette, et al., "Control of Vertical-Cavity Laser Polarization with Anisotropic Transverse Cavity Geometries", IEEE Photonics Technology Letters, vol. 6, No. 1, Jan. 1994, pp. 40-42.
F. Monti di Sopra et al., "Polarization Control in Strained T-bar VCSELs", IEEE Photonics Technology Letters, vol. 14, No. 8, Aug. 2002, pp. 1034-1036.
Kent D. Choquette, et al., "Control of Vertical-Cavity Laser Polarization with Anisotropic Transverse Cavity Geometries", IEEE Photonics Technology Letters, vol. 6, No. 1 Jan. 1994, pp.40-42.

* cited by examiner

*Primary Examiner*—Lex Malsawma
(74) *Attorney, Agent, or Firm*—Oblon, Spivak, McClelland, Maier & Neustadt, P.C.

(57) ABSTRACT

In a vertical cavity surface emitting laser diode manufactured on a non-off-angle substrate with a (100)-oriented plane or the like, anisotropic stress is applied to a central portion of an active layer by forming a asymmetrical oxidation structure in an Al high concentration portion in the mesa, so that polarization controllability of a device can be improved.

15 Claims, 18 Drawing Sheets

ON SUBSTRATE WITH FACE ORIENTATION (100) PLANE

ON 10° OFF-ANGLE SUBSTRATE INCLINED FROM FACE ORIENTATION (100) PLANE

A-A SECTION

B-B SECTION

B-B ENLARGED VIEW

VERTICAL CAVITY SURFACE EMITTING LASER DIODE AND METHOD FOR MANUFACTURING THE SAME

CROSS-REFERENCE TO RELATED APPLICATION

This application is based upon and claims the benefit of priority from prior Japanese Patent Application No. 2003-377246 filed on Nov. 6, 2003 in Japan, the entire contents of which are incorporated herein by reference.

BACKGROUND OF THE INVENTION

1. Field of the Invention

The present invention relates to a vertical cavity surface emitting laser (VCSEL) diode and a method for manufacturing the same, and in particular to a vertical cavity surface emitting laser diode which can control a polarization mode stably and a method for manufacturing the same.

2. Related Art

A semiconductor light emitting device such as a semiconductor laser or a vertical cavity surface emitting laser (VCSEL) is widely used as a light source for such an optical disc system as a CD (a compact disc) or a DVD (a digital versatile disc), or a barcode reader, including an optical communication field. When the semiconductor light emitting device is used in various application fields including these optical communications, it is important to obtain single-mode operation for three modes of "longitudinal mode", "transverse mode" and "polarization mode" present in a semiconductor laser. Nowadays, a semiconductor laser diode with an edge emission type mainly used in the optical communication field operates stably in the polarization mode. This is because a resonant cavity in the edge emission laser diode is constituted of a waveguide, a reflectance on an end face of the waveguide is larger in linear TM (Transverse Magnetic) polarization than in TE (Transverse Electric) polarization, and electric field vector oscillates due to TE wave in a direction parallel to a semiconductor substrate. Single-mode operation for the longitudinal mode can also be realized by a distributed feedback (DFB) structure and one for the transverse mode can be achieved with a narrow stripe structure.

On the other hand, in the surface emitting laser such as VCSEL, since a resonant cavity is extremely short, the longitudinal mode operates in a single mode, and the transverse mode can operate in a single mode with a narrow current confinement structure obtained by selective oxidation of a layer with aluminum (Al) high concentration or proton implantation.

As to the polarization mode, VCSEL inherently lacks strong polarization anisotropy due to the symmetry of the devices. The linear TE polarization is free to be randomly oriented in the plane of the active region since there is no gain difference between two orthogonal polarized waves in the active layer itself of VCSEL devices. Polarization instability of VCSEL results from difficulty in application of such means that a reflectance of a reflecting mirror for the polarized waves in a specific orientation or direction is increased due to no gain difference between orthogonal polarized waves. For this reason, switching between polarized modes of VCSEL occurs easily due to small fluctuation in external conditions such as a temperature or a driving current, which largely influences optical magnetic recording or coherent optical communication system which directly utilizes polarization states of laser beam. Even when ordinary data communication is performed, polarization instability causes excessive noises or modal competition such a problem as increase in error or restriction to a transmission band arises. Therefore, control (stabilization) for the polarization mode is one of important problems to be solved in order to achieve an actual application of the VCSEL.

Since the importance of polarization control was indicated, conventional approaches for solving the problem about the polarization control have been proposed as follows:

(1) Structure where metal dielectric diffraction grating is assembled in a Distributed Bragg Reflector (DBR) mirror constituted of a semiconductor multi-layered.

(2) Structure where asymmetry has been taken in a mesa shape in a device (3) Structure where production is made on an off angle substrate The approach (1) of the three approaches is a method where metal fine wires are arranged on a DBR mirror in a specific orientation so that a reflectance of the DBR mirror to a polarized light in a specific orientation is made high. Since the reflectance of the mirror to a polarized light parallel to the metal wires becomes high, the method is effective to a certain extent for the polarization stability, but it is difficult to manufacture a device having such a structure because it is necessary to form each metal wire with a width equal to or less than light wavelength of laser.

The approach (2) of taking asymmetry in a mesa shape of a device is disclosed in Japanese patent Application Laid-open No. 11-54838 (herein, also called Patent Literature 1), for example. As shown in FIGS. 21A and 21B, stress is unequally (anisotropically) applied to an active layer at the center of a mesa M by forming stress adding regions 24 around the mesa M, so that stress is generated anisotropically. Incidentally, FIGS. 21C and 21D are diagrams of a stress distribution corresponding to the structure shown in FIGS. 21A and 21B, respectively. A gain difference between orthogonal polarized waves occurs due to such stress, and only polarized waves in a specific direction become preferential so that polarization controllability can be increased.

Similarly, as shown in FIG. 22, IEEE Photon. Technol. Lett., Vol. 14, No. 8, 1034 (2002) (hereinafter, also called Non-Patent Literature 1) also discloses that T-shaped projection shapes 24 are respectively added to both side of a cylindrical mesa M. With such a structure, the layers with Al high concentration ($Al_{0.9}Ga_{0.1}As$ layer) of the T-shaped fine wire portion of a DBR mirror are all oxidized by a selective oxidization process, and anisotropic strain is applied on an active layer positioned at the center of the mesa M by strong stress occurring due to volume shrinkage, which results in increase in polarization controllability.

IEEE Photon. Technol. Lett., Vol. 6, No. 1, 40 (1994) (hereinafter, also called Non-Patent Literature 2) describes that current injection to an active layer is made symmetric to achieve polarization control by employing a dumbbell-shaped mesa structure as shown within a circle 25 in FIG. 23. The stress adding region 24 or the asymmetrical mesa structure 25 causes such a problem as insufficiency in device productivity or reproduction easiness due to complication in device working step, or insufficient polarization controllability like the above-described approach (1).

On the other hand, the approach (3) using an off-angle substrate utilizes such a fact that an active layer is formed on a crystal plane with a big off-angled orientation such as (311) A plane or (311) B plane in order to increase a gain to polarization state in a certain orientation and the gain depends on a crystal orientation. In this approach, a strong extinction ratio between orthogonal polarized waves is obtained and controllability in a polarization mode is excellent. However, it is difficult to achieve high quality crystal for the growth on off-angle substrate, as compared with the case of a non-off-angle (100)-oriented substrate, which causes such a problem that it becomes difficult to obtain a high power output. Further, in a oxidized-confined VCSEL diode with an off-angle substrate, the shape of oxide-aperture to confine the current is distorted according to a difference in oxidation rate (anisotropic oxidation) due to a crystal orientation, which results in difficulty in control on a beam shape.

The VCSEL diode includes the problem about the polarization mode control, but it has various advantages including a low threshold operation, a lower power consumption, a high slope efficiency, possibility of fast modulation, small beam divergences and easiness of coupling with an optical fiber, excellent mass productivity due to no-need for an end face cleavage, as compared with the edge emission type semiconductor laser. Further, since it is possible to integrate many laser devices on a substrate in a 2-dimensional array, much attention has been paid to the VCSEL device as a key device in an optical electronics field including a fast optical LAN (Local Area Network), an optical interconnect or the like. Accordingly, it is strongly desired to provide a surface emitting type semiconductor laser device such as VCSEL which solves the above-described problems and has an improved polarization controllability and an excellent mass productivity.

As described above, in the VCSEL device fabricated on a non-off-angle substrate with a (100)-oriented plane or the like, since a gain difference between orthogonal polarized waves does not occur in an active layer due to symmetry of a crystal structure, switching between polarization states is caused easily, which results in such a problem that it is difficult to control the polarization mode.

SUMMARY OF THE INVENTION

The present invention has been made based upon understanding about such a problem, and an object thereof is to provide a vertical cavity surface emitting laser diode with a high performance which provides an excellent controllability on a polarization mode and an improved mass productivity, even if the device is fabricated on a non-off-angle substrate with a (100)-oriented plane or the like, and a method for manufacturing the same.

A vertical cavity surface emitting laser diode according to a first aspect of the present invention includes: a substrate; a semiconductor active layer which is formed on a principal face of the substrate and has a light emitting region; a first semiconductor multi-layered reflecting mirror and a second semiconductor multi-layered reflecting mirror which sandwich the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer; a pair of electrodes configured to inject current into the semiconductor active layer; a current confinement portion which is formed in the vicinity of the semiconductor active layer and has a plurality of layers to be oxidized including Al; a recessed portion which has a groove depth reaching at least the uppermost layer of the layers to be oxidized; and a mesa portion which is surrounded by the recess portion, the current confinement portion including a first and second current confinement portions, the first current confinement portion having the first layer number of layers to be oxidized of the plurality of layers to be oxidized which have oxidized side portions and the second current confinement portion having the second layer number of layers to be oxidized of the plurality of layers to be oxidized which have oxidized side portions, the first layer number being smaller than the second layer number.

A vertical cavity surface emitting laser diode according to a second aspect of the present invention includes: a substrate; a semiconductor active layer which is formed on a principal face of the substrate and has a light emitting region; a first semiconductor multi-layered reflecting mirror and a second semiconductor multi-layered reflecting mirror which sandwich the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer; a pair of electrodes configured to inject current into the semiconductor active layer; a current confinement portion which is formed in the vicinity of the semiconductor active layer and has a layer to be oxidized including Al; a first recessed portion which has a groove depth such that a bottom thereof reaches the layer to be oxidized; a second recessed portion which has a groove depth such that a bottom thereof reaches the lowermost layer of the second semiconductor multi-layered reflecting mirror; and a mesa portion which is surrounded by the first and second recessed portions, a side portion of the first semiconductor multi-layered reflecting mirror being oxidized at the first recessed portion and a side portion of the second semiconductor multi-layered reflecting mirror being oxidized at the second recessed portion.

A vertical cavity surface emitting laser diode according to a third aspect of the present invention includes: a substrate; a semiconductor active layer which is formed on a principal face of the substrate and has a light emitting region; a first semiconductor multi-layered reflecting mirror and a second semiconductor multi-layered reflecting mirror which sandwich the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer; a pair of electrodes configured to inject current into the semiconductor active layer; a current confinement portion which is formed in the vicinity of the semiconductor active layer and has a layer to be oxidized including Al, a side portion of the layer to be oxidized being oxidized and a central portion thereof being non-oxidized; a recessed portion which has a groove depth such that a bottom thereof reaches at least the uppermost layer of the layer to be oxidized; a mesa portion which is surrounded by the recessed portion, the current confinement portion has a first region where the end portion of the layer to be oxidized has been oxidized and a second region having a length from the end portion longer than that of the first region where the end portion of the layer to be oxidized has been oxidized.

A vertical cavity surface emitting laser diode according to a fourth aspect of the present invention includes: a substrate; a semiconductor active layer which is formed on a principal face of the substrate and has a light emitting region; a first semiconductor multi-layered reflecting mirror and a second semiconductor multi-layered reflecting mirror which sandwiches the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer; a pair of electrodes configured to inject current into the semiconductor active layer; a current confinement portion which is formed in the vicinity of the semiconductor active layer and has a plurality of layers to be oxidized including Al, side portions of the layers to be oxidized being oxidized and a central portion thereof being non-oxidized; a recessed portion which has a groove depth reaching at least the uppermost layer of the layers to be oxidized; and a mesa portion which is surrounded by the recess portion, at least one of the first and second semiconductor multi-layered reflecting mirrors having an oxidized region formed by oxidation from an end face thereof, and the oxidized region having a first portion where oxidation length from the end face is short and a second region where oxidation length from the end face is longer than that of the first portion.

Here, in the first portion, a non-oxidized region adjacent to the oxidized region may be a region containing proton with higher concentration than that in the oxidized region.

A method for manufacturing a vertical cavity surface emitting laser diode according to a fifth aspect of the present invention includes: providing an active layer and a plurality of layers to be oxidized containing Al on a principal face; forming a first recessed portion such that end faces of the first layer number of layers to be oxidized of the plurality of layers to be oxidized are exposed and a second recessed portion such that end faces of the second layer number of layers to be oxidized of the plurality of layers to be oxidized, the second layer number being smaller than the first layer number; and advancing oxidation from the end faces of the layers to be oxidized which are exposed at the first and second recessed portions.

A method for manufacturing a vertical cavity surface emitting laser diode according to a sixth aspect of the present invention includes: stacking an active layer and a semiconductor multi-layered reflecting mirror on a principal face of a substrate; and forming a first portion where proton is implanted on the semiconductor multi-layered reflecting mirror so as to surround a portion to be set as a light emitting region as viewed from the principal face and a second portion where proton is not implanted on the semiconductor multi-layered reflecting mirror; and advancing oxidation of at least one of semiconductor layers constituting the semiconductor multi-layered reflecting mirror from end faces of the first and second portions.

The term "a layer to be oxidized" generally means a layer which should be oxidized, but it can include a layer before oxidized and a layer after oxidized in this text or specification.

DETAILED DESCRIPTION OF THE INVENTION

Embodiments of the present invention will be explained below with reference to the drawings.

FIRST EMBODIMENT

Figure 1:
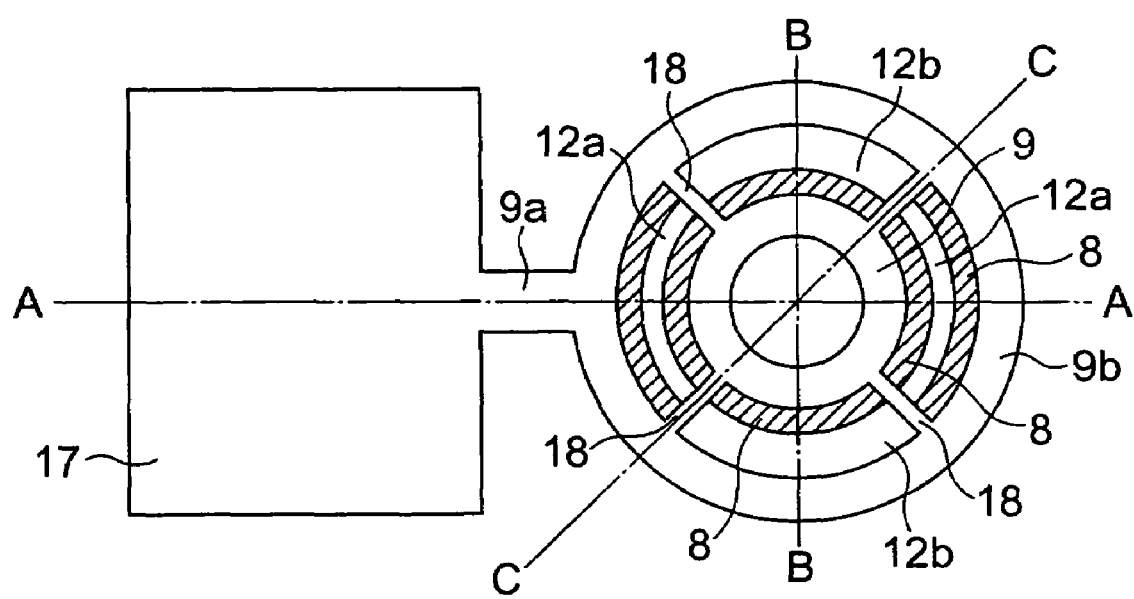
FIG. 1 is a top view of a structure of a VCSEL diode according to a first embodiment of the present invention.
Figure 2:
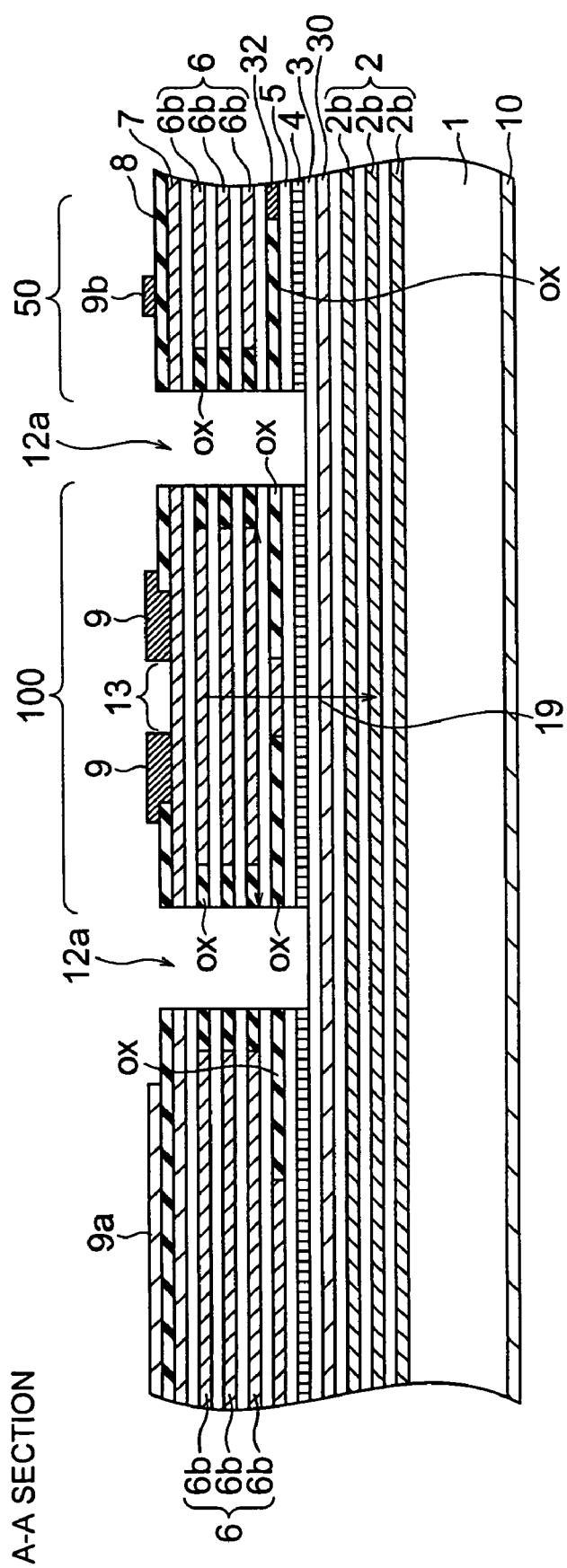
FIG. 2 is a sectional view of the VCSEL diode taken along line A-A shown in FIG. 1, which represents a state that only an upper layer 32 of layers to be selectively oxidized has been selectively oxidized.
Figure 3:
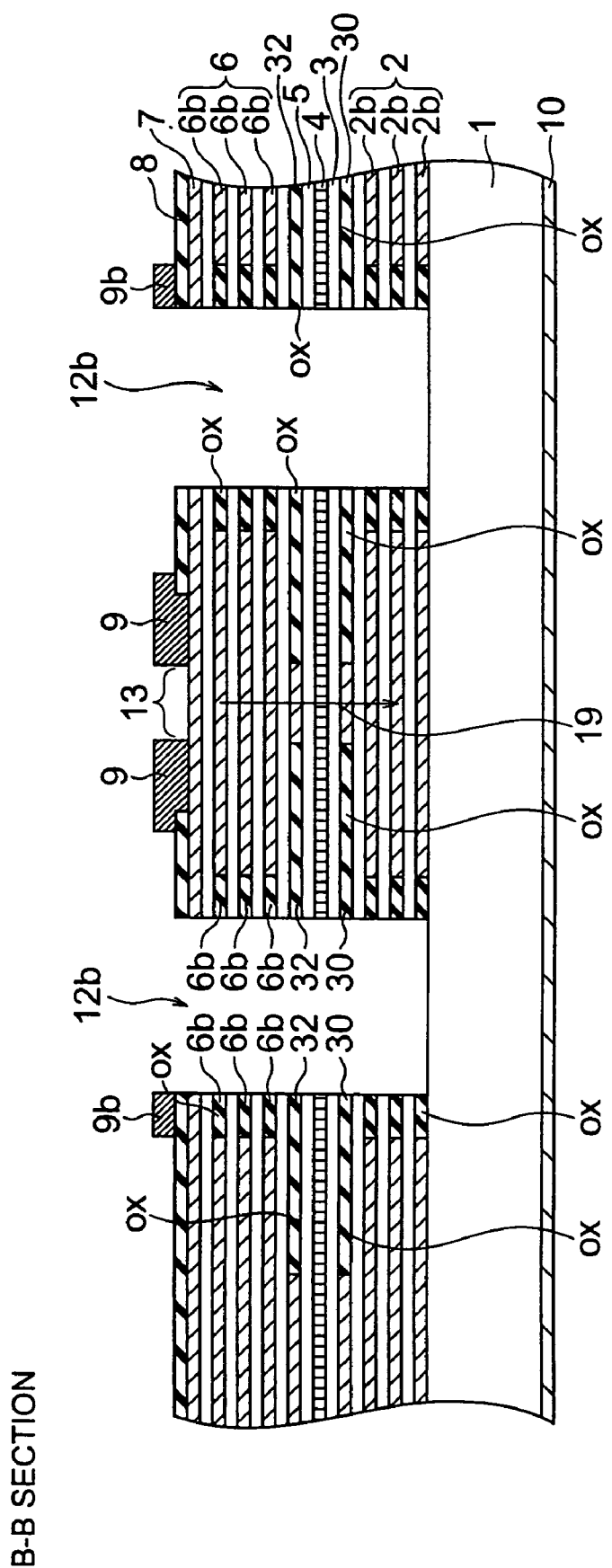
FIG. 3 is a sectional view of the VCSEL diode taken along line B-B shown in FIG. 1, which represents a state that the upper layer 32 and a lower layer 30 of the layers to be selectively oxidized has been selectively oxidized.
Figure 4:
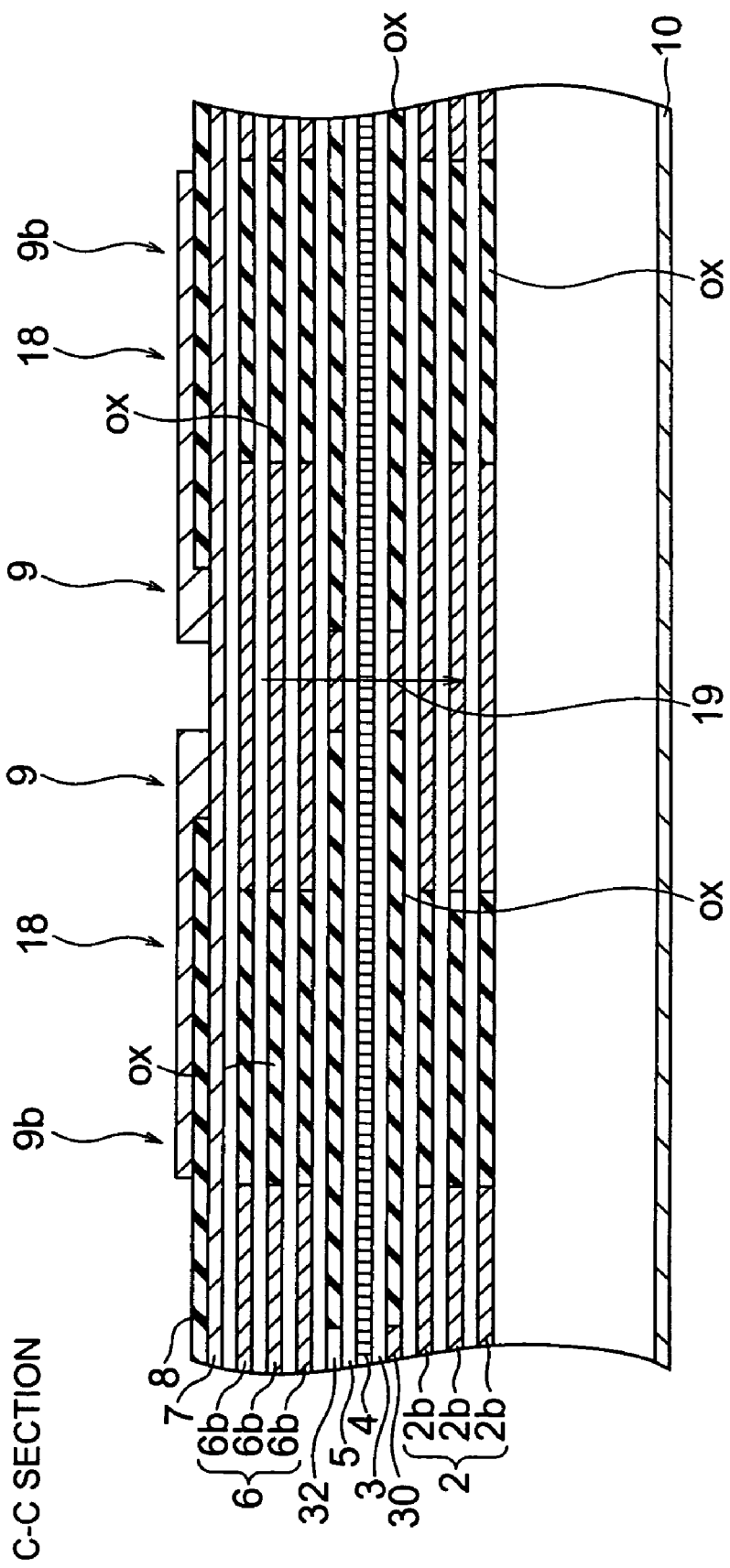
FIG. 4 is a sectional view of the VCSEL diode taken along line C-C shown in FIG. 1, which represents a structure of a mesa portion 100 positioned below a wire path portion 18.

FIGS. 1 to 4 are illustrative views of a structure of a vertical cavity surface emitting laser (VCSEL) diode according to a first embodiment of the invention, FIG. 1 being a top view thereof, and FIGS. 2 to 4 being sectional views thereof taken along line A-A, line B-B and line C-C shown in FIG. 1, respectively. That is, FIG. 2 is a sectional view of the VCSEL diode where only an upper layer 32 to be selectively oxidized has been selectively oxidized, FIG. 3 is a sectional view thereof where the upper layer 32 and a lower layer 30 to be selectively oxidized have been selectively oxidized, and FIG. 4 is a sectional view of a mesa portion 100 positioned below a wire path 18.

The VCSEL diode has a semiconductor active layer 4, a first semiconductor multi-layered reflecting mirror 6 formed on a top of the semiconductor active layer 4, and a second semiconductor multi-layered reflecting mirror 2 formed under the semiconductor active layer 4 on a substrate 1 with a non-off-angle such as (100)-oriented plane. The semiconductor multi-layered reflecting mirrors 2 and 6 constitute an optical cavity extending in a direction perpendicular to a main face of the substrate 1. Semiconductor cladding layers 3 and 5 are respectively formed between the semiconductor active layer 4 and the reflecting mirror 2 and between the semiconductor active layer 4 and the reflecting mirror 6.

An upper layer to be oxidized 32 including aluminum (Al) at a high concentration and a lower layer to be oxidized 30 including aluminum (Al) at a high concentration is provided between the semiconductor multi-layered reflecting mirror 6, 2 and the cladding layer 5, 3. The layers to be oxidized 32 and 30 have oxidized regions OX formed by oxidizing them from side walls of the mesa region 100 toward a light emitting region 13 laterally. A current confinement portion is formed by these oxidized regions OX. Current 19 injected via an electrode 9 and an electrode 10 is narrowed into the light emitting region 13 by the current confinement portion. In this embodiment, as described in detail later, by making the layer number of oxidized regions OX different between line A-A direction and line B-B direction, non-isotropic stress is applied to the active layer 4, thereby realizing high polarization controllability.

A contact layer 7 is formed on the first semiconductor multi-layered reflecting mirror 6, and a contact electrode 9 for injecting current into the light emitting region 13 are formed via the contact layer 7. The contact electrode 9 is formed so as to open a top of the light emitting region 13.

An electrode 10 is formed on a back face of the substrate 1, and current is injected into the light emitting region 13 via the second semiconductor multi-layered reflecting mirror 2.

Etching regions (recessed portions) 12a are formed outside the mesa portion 100 in a direction of line A-A in FIG. 1, as also shown in FIG. 2. The depth of each etching region 12a is adjusted such that side faces of the first semiconductor multi-layered reflecting mirror 6 and the upper layer to be oxidized 32 are exposed but a bottom the etching region 12a does not reach the lower layer to be oxidized 30 or the second semiconductor multi-layered reflecting mirror 2. On the other hand, etching regions (recessed portions) 12b are formed outside the mesa portion 100 in a direction of line B-B in FIG. 1, as also shown in FIG. 3. The depth of each etching region 12b is adjusted such that not only side faces of the upper layer to be oxidized 32 and the first semiconductor multi-layered reflecting mirror 6 but also side faces of the lower layer to be oxidized 30 and the semiconductor multi-layered reflecting mirror 2 are exposed.

A peripheral portion 50 provided outside the etching regions 12a and 12b has a stacked structure similar to that of the mesa portion 100. A surface of the mesa portion 100 and a surface of the peripheral portion 50 are formed so as to be substantially flush with each other.

A peripheral electrode 9b is formed on the peripheral portion 50. The contact electrode 9 and the peripheral electrode 9b are connected to each other through the wire path 18. Protective films 8 formed of silicon nitride film, for example, are properly provided on the contact layer 7.

Such a VCSEL diode can emit light or beam by injecting current from the contact electrode 9 to the active layer 4 via the first semiconductor multi-layered reflecting mirror 6, as shown with arrow 19.

The VCSEL has structures so as not to require a planarization processing, because the contact electrode 9 and the peripheral electrode 9b, and the wire path 18 connecting these electrodes are formed substantially in the same level (height). Therefore, the embodiment has such a merit that "breaking due to step" of a wire can be prevented.

Since an oxidized region OX formed by oxidizing the Al high concentration layer 6b constituting the first semiconductor multi-layered reflecting mirror 6 is provided in a lower layer of the wire path 18 connecting the contact electrode 9 and the peripheral electrode 9b, current can not flow in a lateral direction. Accordingly, in the VCSEL diode, current can be flowed only through the current path indicated by arrow 19, so that current confinement can be achieved considerably efficiently. As a result, reduction in threshold, fast response performance and improvement in mass productivity can be achieved.

As described above, in this embodiment, the layer number of the oxidized regions OX is different between the line A-A direction and the line B-B direction. That is, in case of the specific embodiment shown in FIGS. 1 to 4, the oxidized regions OX are formed in only the first semiconductor multi-layered reflecting mirror 6 and the upper layer to be oxidized 32 in the line A-A direction, while the oxidized regions OX are respectively formed in the first and second semiconductor multi-layered reflecting mirror 6, 2, and the upper layer to be oxidized 32 and the lower layer to be oxidized 30 in the line B-B direction. That is, the layer number of the oxidized regions OX is different between the line A-A direction and the line B-B direction.

In production of an oxide-confined VCSEL diode, when an AlGaAs (aluminum gallium arsenide) layer (it is desirable that a composition ratio of Al occupying in III—group elements is 95% or more) which is the layer to be oxidized including AlAs (aluminum arsenide) or Al in a high concentration is steam-oxidized, the layers to be oxidized 32, 30 or only the layer to be oxidized 32 is oxidized from the side wall of the mesa portion 100, so that a current confinement portion is formed. Compressive stress generated due to volume shrinking according to oxidation of the layers to be oxidized 32, 30 greatly acts on the semiconductor active layer 4 at a central portion of the mesa portion 100 in the line B-B direction but it slightly acts thereon in the line A-A direction. That is, anisotropic strain is applied to the active layer 4. When an oxidized layer Alx (Ga) Oy is formed, a volume shrinking (about 10% to 13%) occurs as compared with the original Al (Ga) As layer, so that a large compressive stress in the order of giga pascal (GPa) is applied to the active layer 4 or the central portion of the mesa structure after oxidized. When AlAs is used as material for the layers to be oxidized 32, 30, since the volume shrinking due to oxidation ranges in 12 to 13%, compressive stress F1 of 1 to 10 GPa occurs per one layer to be oxidized, and the compressive stress applied on the active layer 4 is different between the line A-A direction (F1 applied by only the upper layer) and the line B-B direction (2×F1 applied by the upper and lower layers).

In order to realize the current confinement effectively, the oxidized region OX serving as a current confinement layer (current aperture) must have a thickness in a certain extent, but stress applied becomes larger according to increase in thickness of the layer to be oxidized or increase in the number of layers. In addition, since the stress is concentrated into a distal end of the oxidized region OX and the layers to be oxidized 32, 30 are provided at point-blank range of about 0.2 μm from the active layer 4, the stress can influence a region of the active layer 4 to which current is extremely concentrated. That is, according to this embodiment, anisotropy of stress application becomes large, which results in remarkable improvement in polarization controllability.

In the method disclosed in the Patent Literature 1 or the Non-Patent Literatures 1 and 2, the structure where the stress (strain) adding regions 24 are provided around the peripheral portion of the mesa. On the other hand, in this embodiment, the stress (strain) adding region is provided at the central portion of the mesa portion, so that the structure that the stress adding region is positioned nearest to the active layer 4 of the light emitting region is realized. Stress applied to the active layer 4 of the light emitting region decreases in inverse proportion to a distance from the stress (stain) adding region. According to the structure of the embodiment where the stress (strain) adding region is provided nearest to the active layer 4 of the light emitting region, a considerably large strain can be applied to the light emitting region of the active layer 4, so that it is made possible to improve polarization controllability remarkably.

When a film stress is present in each layer grown on the substrate, a compressive stress or a tensile stress is applied on the semiconductor active layer 4 in an anisotropic manner in a horizontal direction to the substrate surface due to a difference in etching volume to the recessed portions (etching regions for mesa portion) 12a, 12b between the line A-A direction and the line B-B direction so that the polarization controllability can further be improved.

When formation is made on an off-angle substrate whose face orientation has been inclined from a (100)-oriented plane, such a problem arises that a shape of a current confinement portion is made unsymmetrical and deformed due to anisotropic oxidation, when selective oxidation is made. On the other hand, in case of a VCSEL diode formed on a non-off-angle substrate with face orientation (100) plane, a symmetrical current confinement portion can be formed by selective oxidation.

As explained above, according to the embodiment, in fabrication of an oxide-confined VCSEL diode, polarization controllability is enhanced and mass productivity of a VCSEL diode with a high performance is improved.

Next, a method for manufacturing the VCSEL diode of the embodiment will be explained specifically.

First, an n-type semiconductor multi-layered reflecting mirror 2b, a layer to be oxidized 30 forming a current confinement portion, a cladding layer 3, a semiconductor active layer 4, a cladding layer 5, a layer to be oxidized 32 forming the current confinement portion, a p-type semiconductor multi-layered reflecting mirror 6b and a contact layer 7 are sequentially grown on a cleaned n-type GaAs substrate 1 with a face orientation (100) plane having a thickness of 400 μm and a size of 3 square inches by using a MOCVD (metal organic chemical vapor deposition) apparatus.

Considering a structure where the semiconductor multi-layered reflecting mirrors 2 and 6 are disposed above and below an optical cavity constituted of the semiconductor active layer 4 and the cladding layers 3 and 5 as a basic structure, design and fabrication were made so as to obtain an optimal performance as a GaInAsN VCSEL with 1.3 μm range wavelength.

The semiconductor multi-layered reflecting mirror 2 had such a structure that n-type GaAs layers (high refractive index layers) and n-type $Al_yGa_{1-y}As$ (0<y<1) (low refractive index layers) were alternately stacked with a thickness of an optical wavelength ¼ to a wavelength 1.3 μm. In this embodiment, an $Al_{0.94}Ga_{0.06}As$ layer with Al composition of y=0.94 was used as the lower refractive index layer. Si (silicone) was used as an n-type dopant for the semiconductor multi-layered reflecting mirror 2, where the dopant concentration was $2\times10^{18}/cm^3$. The lower cladding layer 3 was formed from n-type GaInP.

The semiconductor active layer 4 had such a quantum well structure that $Ga_xIn_{1-x}As_yN_{1-y}$ ($0\leq x\leq 1$, $0\leq y<1$) layer adjusted so as to obtain a light emitting peak wavelength of 1.3 μm and a GaAs layer serving as a barrier layer were stacked alternately. Here, such a triple quantum well structure was employed that GaAs layers were stacked so as to sandwich the $Ga_xIn_{1-x}As_yN_{1-y}$ ($0\leq x\leq 1$, $0\leq y<1$) layer from above and below. The In composition in the $Ga_xIn_{1-x}As_yN_{1-y}$ ($0\leq x\leq 1$, $0\leq y<1$) layer constituting the quantum well layer was in a range of 30% to 35%, the nitrogen composition therein was in a range of 0.5% to 1.0%, and the $Ga_xIn_{1-x}As_yN_{1-y}$ ($0\leq x\leq 1$, $0\leq y<1$) layer had a thickness of 7 nm.

As the $Ga_xIn_{1-x}As_yN_{1-y}$ ($0\leq x\leq 1$, $0\leq y<1$) layer, $Ga_{0.66}In_{0.34}As_{0.99}N_{0.01}$ of a composition which was controlled such that a lattice constant thereof was larger than that of the n-type GaAs substrate 1 and which had a compressive stress amount of about 2.5% was used. At this time, a differential gain coefficient increased so that the threshold current value was further reduced, as compared with a non-strain case.

The upper cladding layer 5 was formed from p-type GaInP. The semiconductor multi-layered reflecting mirror 6 had such a structure that p-type GaAs layers (high refractive index layers) and p-type $Al_yGa_{1-y}As$ (0<y<1) (low refractive index layers) were alternately stacked with a thickness of an optical wavelength ¼ to a wavelength 1.3 μm. In this embodiment, an $Al_{0.94}Ga_{0.06}As$ layer with Al composition of y=0.94 was used as the lower refractive index layer like the n-type semiconductor multi-layered reflecting mirror 2. C (carbon) was used as p-type dopant for the semiconductor multi-layered reflecting mirror 6, where a dopant concentration was set in a range of $2\times10^{18}/cm^3$ (a portion in the vicinity of the quantum well layer 4) to $1\times10^{19}/cm^3$ (a portion in the vicinity of the contact layer 7).

The upper layer to be oxidized 32 and the lower layer to be oxidized 30 were respectively formed above the cladding layer 5 and below the cladding layer 3, and $Al_xGa_{1-x}As$ ($x\geq 0.98$) whose Al composition ratio was larger than that of AlGaAs constituting the upper and lower semiconductor multi-layered reflecting mirror 6 and 2 was used as material for these layers. In this embodiment, AlAs layers were used in both the upper and lower layers as the layers to be oxidized.

The contact layer 7 was formed from p-type GaAs, where C (carbon) was used as p-type dopant and a dopant concentration was set to $2\times10^{19}/cm^3$.

Next, a $Si_3N_4$ film was formed as a protective film 8 also serving as an etching mask for pattern forming. The $Si_3N_4$ film was formed as a film with a tensile stress of 150 MPa by adjusting pressures and flow rates of material gases SiH4, NH3, N2 to control a film stress. The value of the film tensile stress was determined considering a thermal stress σT generated between the etching mask film 8 and the GaAs substrate 1 in a steam oxidation process. When a temperature in the steam oxidation process was set to 400° C., a compressive stress with σT=−150 MPa was generated between the $Si_3N_4$ film (EF=160 GPa, αF=$2.7\times10^{-7}$/K) and GaAs (αS=$6.0\times10^{-6}$/K) of the substrate. In order to relax the compressive stress, the film having a tensile stress was formed and a thermal stability was enhanced.

Next, a mesa portion 100 was produced by performing etching in a photolithography and etching process. A mesa pattern was etched in an ICP (Inductively Coupled Plasma) plasma dry etching apparatus using mixed gas of boron trichloride and nitrogen. At this time, as shown in FIGS. 1 to 3, a mesa structure where etching depths for recessed portions having different opening areas were different from each other was produced by making widths of openings in the etching region for mesa formation 12 different between the line A-A direction and the line B-B direction to utilize a so-called "micro-loading effect" where an etching rate was changed according to an area of an opening.

By adjusting a gas pressure, an antenna output, and a substrate temperature, the fabrication of the mesa portion 100 was performed, where the etching was performed regarding side walls of the mesa portion 100 such that only the upper layer 32 of the layers to be oxidized was exposed in the etching region 12a in the line A-A direction, and the upper layer and lower layer 32 and 30 of the layers to be oxidized were exposed in the etching region 12b in the line B-B direction.

In the embodiment, in the etching region for mesa formation, a ratio of the opening areas in the line A-A direction and in the line B-B direction was set to 1:3 and a ratio of the etching depths was set to 1:2, and a ratio of the etching volumes was 1:6. As the embodiment, when a crystal growth of highly strained $Ga_xIn_{1-x}As_yN_{1-y}$ quantum well layer and the like is performed on a substrate, each layer eventually has a large film stress. Accordingly, a compressive stress or a tensile stress is asymmetrically applied on the semiconductor active layer 4 in a horizontal direction to a substrate face due to a difference in etching volume between the etching region 12a and the etching region 12b in mesa formation, which results in further enhancement in polarization controllability. Here, a vertical shape etching for the mesa with a diameter of 45 μm was performed in order to produce a VCSEL diode having the light emitting region 13 with an opening diameter of 5 μm.

Next, a selective oxidation process was performed. That is, a thermal treatment at a temperature of 400° C. was conducted in a steam atmosphere to selectively oxidize the upper layer to be oxidized 32 and the lower layer to be oxidized 30 over a length of 20 μm laterally to form oxidized regions OX, thereby forming the light emitting region 13 with a diameter of about 5 μm.

At this time, the layers to be oxidized 32 and 30 were selectively oxidized laterally from the side walls of the mesa portion 100 toward the light emitting region 13, which resulted in shrinkage of the AlAs layers of the layers 32 and 30 to be oxidized in volume according to change to $Al_2O_3$ layers. A compressive stress F1 of 1 GPa to 10 GPa per one layer of the layers to be oxidized was generated to be applied to the active layer 4 at the central portion of the mesa portion. At this time, the stress in the line A-A direction is F1, because only the upper layer 32 serves, and the stress in the line B-B direction becomes (2×F1), because the upper layer 32 and the lower layer 30 serves. That is, since the compressive stress applied to active layer 4 is largely made different due to a direction, a gain difference between linear polarized waves is generated in the semiconductor active layer 4, which improves polarization controllability.

In the steam oxidization process, the Al high concentration layers constituting the first semiconductor multi-layered reflecting mirror 6 were oxidized from the side wall of the recessed portion laterally like the layers to be oxidized 32 and 30. Thereby, oxidized layers of the Al high concentration layers constituting the first semiconductor multi-layered reflecting mirror 6 were formed below the wiring path 18 connecting the contact electrode 9 and the peripheral electrode 9b. By setting the width of the wire path 18 to be two times or less than an oxidation length from the side walls of the Al high concentration layers constituting the first semiconductor multi-layered reflecting mirror 6, all the Al high concentration layers exposed to the side wall of the recessed portion and constituting the first semiconductor multi-layered reflecting mirror 6 positioned below the wire path 18 were oxidized so that a leak current 22 could be prevented from flowing outside the mesa region.

Next, the etching mask film 8 on the p-type semiconductor multi-layered reflecting mirror 6 was removed so as to correspond to portions to be formed with a bonding pad 17 and the wire paths 18 and a light emitting opening, and a p-side electrode 9 was formed on the p-type GaAs contact layer 7. Simultaneously, a wire portion 9a was formed for connecting the bonding pad 17 and the p-side electrode 9, and an n-side electrode 10 was then formed on a back face of the substrate.

Room-temperature continuous-wave oscillation with a low threshold current density (1 $kA/cm^2$) in an emission wavelength of 1.3 μm is achieved in the fabricated VCSEL diode owing to an effect of highly strained quantum well structure of the active layer 4, where various laser properties of the VCSEL at a high temperature were excellent. In the fabricated VCSEL diode, polarization control was made possible, and fluctuation of polarized wave or switching was prevented. According to this advantage, noises were reduced in the VCSEL diode, which could be used as an optical disc head or a communication device.

Figure 5A:
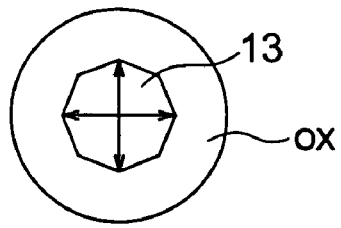
FIG. 5A is an illustrative diagram showing a shape of a non-oxidized region on a (100) plane substrate.
Figure 5B:
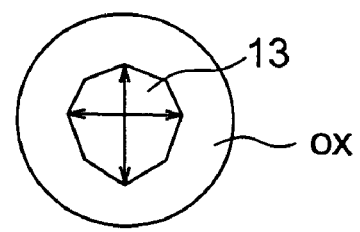
FIG. 5B is an illustrative diagram showing a shape of a non-oxidized region on a 10° off substrate.

The problems about the deformed shape of the non-oxidized region occurring due to the anisotropic oxidization caused when an off-angle substrate was used or the asymmetry of a deformed pattern shape of an emitted beam was improved so that a desired beam pattern shape was obtained. As a result, stabilization in the transverse mode could be achieved. That is, for comparison, when production was made using an off-angle substrate 1 off-angle by 10° from a substrate with a (100)-oriented plane which is said to be effective for improving polarization controllability, a beam shape due to the anisotropic oxidation became significant. In the same cylindrical mesa structure as the embodiment, as shown in FIG. 5B, the shape of the current confinement portion (the light emitting region 13) was distorted in an off-angle direction, a size difference of 1.1 μm occurred between a longitudinal size and a lateral size. On the other hand, when a substrate with a (100)-oriented plane was used, as shown in FIG. 5A, it was confirmed that a symmetrical light emitting region 13 was obtained and a size difference between a longitudinal size and a lateral size was reduced to 0.1 μm. Further, reproducibility over all faces of a wafer was excellent, many devices formed on the same or one wafer were equalized in size and shape and also equalized in laser characteristics such as a single mode operation, a threshold value, and a light output, and mass productivity for a VCSEL diode with a high performance was improved.

In the device of the present invention, since the contact electrode, the peripheral electrode, and the wire connecting these electrodes are formed on substantially the same level, which results in structure which does not require a planarization process, such a merit as prevention of "breaking due to step" of a wire can be obtained. Since the oxidized layers which are the Al high concentration layers constituting the semiconductor multi-layered reflecting mirror, or a high-resistance region formed by proton implantation, as described later, or a hole is formed below the wire path 18 connecting the contact electrode and the peripheral electrode, current confinement can be achieved considerably efficiently, which allows reduction in threshold value and improvement in high speed response and mass productivity.

As the method for blocking leak current to flow outside the mesa region, the embodiment employs utilizing formation of the oxidized regions OX of the Al high concentration layers constituting the first semiconductor multi-layered reflecting mirror 6 below the wire path 18 connecting the contact electrode 9 and the peripheral electrode 9b. However, it was confirmed that similar effect could be obtained by forming a high resistance region below the wire path 18 of the p-side electrode 9 through proton implantation or forming a hole below the wire path 18 and these methods were effective for leak current blocking. In this case, the hole was formed by, after performing the steam oxidation process, forming a resist pattern for isolation and removing the GaAs (contact) layer 7 and the upper semiconductor multi-layered reflecting mirror 6 below the wire path 18 of the p-side electrode according to an SH solution processing. By forming the hole below the wire path 18, leak current could be completely blocked to flow outside the mesa region 100.

In this example, the AlAs layers were used for the layers to be oxidized 32 and 30 for current confinement formation. However, similar effect or advantage can be achieved even when $Al_xGa_{1-x}As$ ($x \geq 0.95$) with a high Al composition ratio is used. When the Al composition ratio is increased, lateral oxidation rate in the steam oxidation process becomes faster, which allows shortening of a process time, and an amount of generation of stress due to lateral oxidation is increased, which is suitable for improvement in mass productivity for a device or polarization controllability.

The case that each of the upper and lower layers to be oxidized 32 and 30 is constituted of one layer has been explained in the above embodiment, but a further effect can be achieve by constituting each layer to be oxidized with a plurality of (sub-)layers. For example, when the upper layer of the layers to be oxidized is constituted of one layer and the lower layer thereof is constituted of two layers, asymmetry of compressive stress applied to the semiconductor active layer 4 is more significant than that of the above specific example, so that polarization controllability can be further improved.

Figure 6:
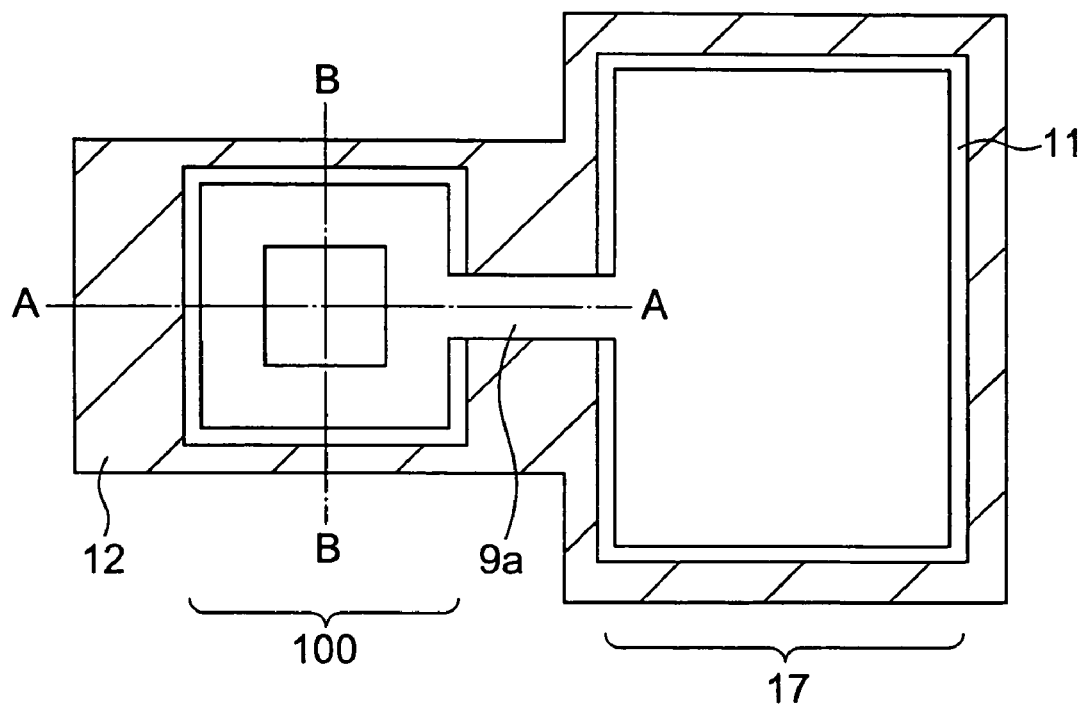
FIG. 6 is a top view showing a structure of a VCSEL diode as a second specific example of the first embodiment.
Figure 7:
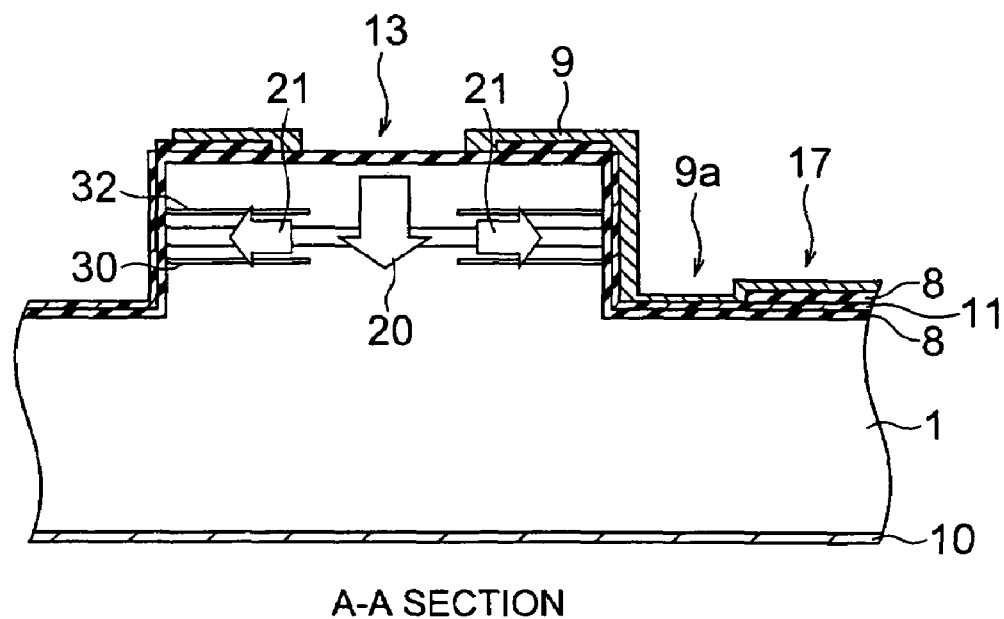
FIG. 7 is a sectional view of the VCSEL diode taken along line A-A shown in FIG. 6.
Figure 8:
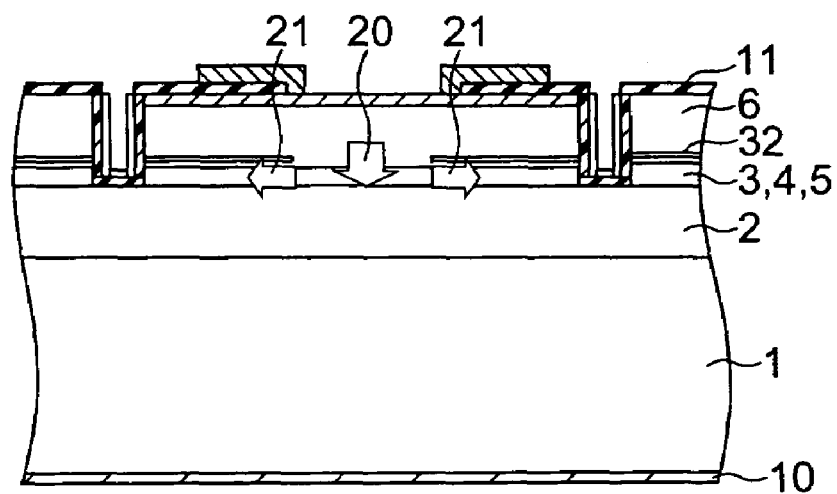
FIG. 8 is a sectional view of the VCSEL diode taken along line B-B shown in FIG. 6.

FIGS. 6 to 8 are illustrative views of a structure of a VCSEL diode as a second specific example of the embodiment, FIG. 6 being a top view thereof, FIG. 7 being a sectional view thereof taken along line A-A shown in FIG. 6, and FIG. 8 being a sectional view thereof taken along line B-B shown in FIG. 6. In these figures, constituent elements similar to those described regarding FIGS. 1 to 5B are denoted by similar reference numerals, and detailed explanation thereof will be omitted.

In this specific example, a VCSEL with square mesa structure where the etching region 12 was not sub-divided was obtained. It was confirmed that the structure could be obtained by a method similar to that described in FIGS. 1 to 5B and similar laser characteristics, polarization controllability and beam shape controllability could be obtained.

That is, in this specific example, such an asymmetrical structure is employed that the oxidized region OX for forming the light emitting region 13 is formed in the upper and lower layers 32 and 30 in the line A-A direction and it is formed in only the upper layer 32 in the line B-B direction. With such a constitution, there occurs a much difference in magnitude of the compressive stress 20 applied to the active layer 4 depending on a direction, which causes a gain difference between linear polarizations in the semiconductor active layer 4, thereby improving polarization controllability. By employing different etching volumes for respective recessed portions, a compressive stress force or a tensile stress force 21 is asymmetrically applied on the semiconductor active layer 4 in a horizontal direction to the substrate surface, which contributes to further improvement in polarization controllability. In the structure in the specific example, for suppressing "breaking due to step" of a wire, polyimide 11 is formed on a surface of the etching region 12 for mesa formation and the bonding pad 17, the wire portion 9a, and the contact electrode 9 are formed via the polyimide 11.

Figure 9:
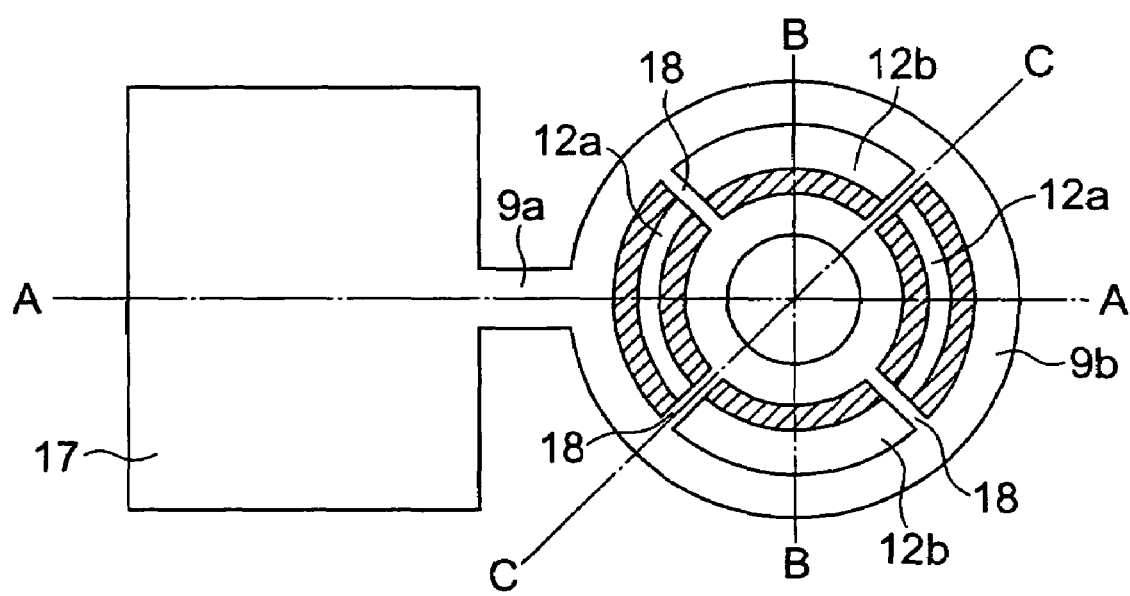
FIG. 9 is a top view showing a structure of a VCSEL diode as a third specific example of the first embodiment.
Figure 10:
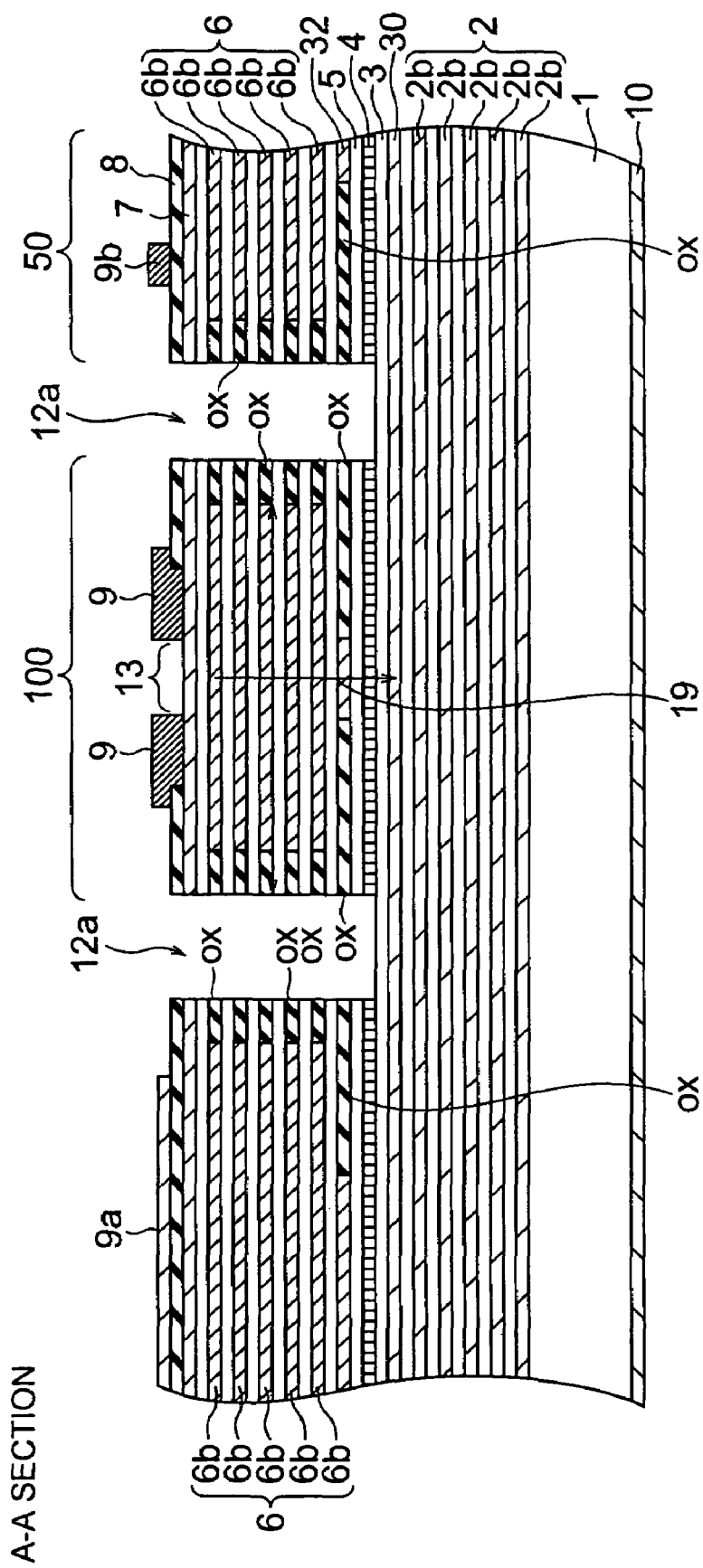
FIG. 10 is a sectional view of the VCSEL diode taken along line A-A shown in FIG. 9.
Figure 11:
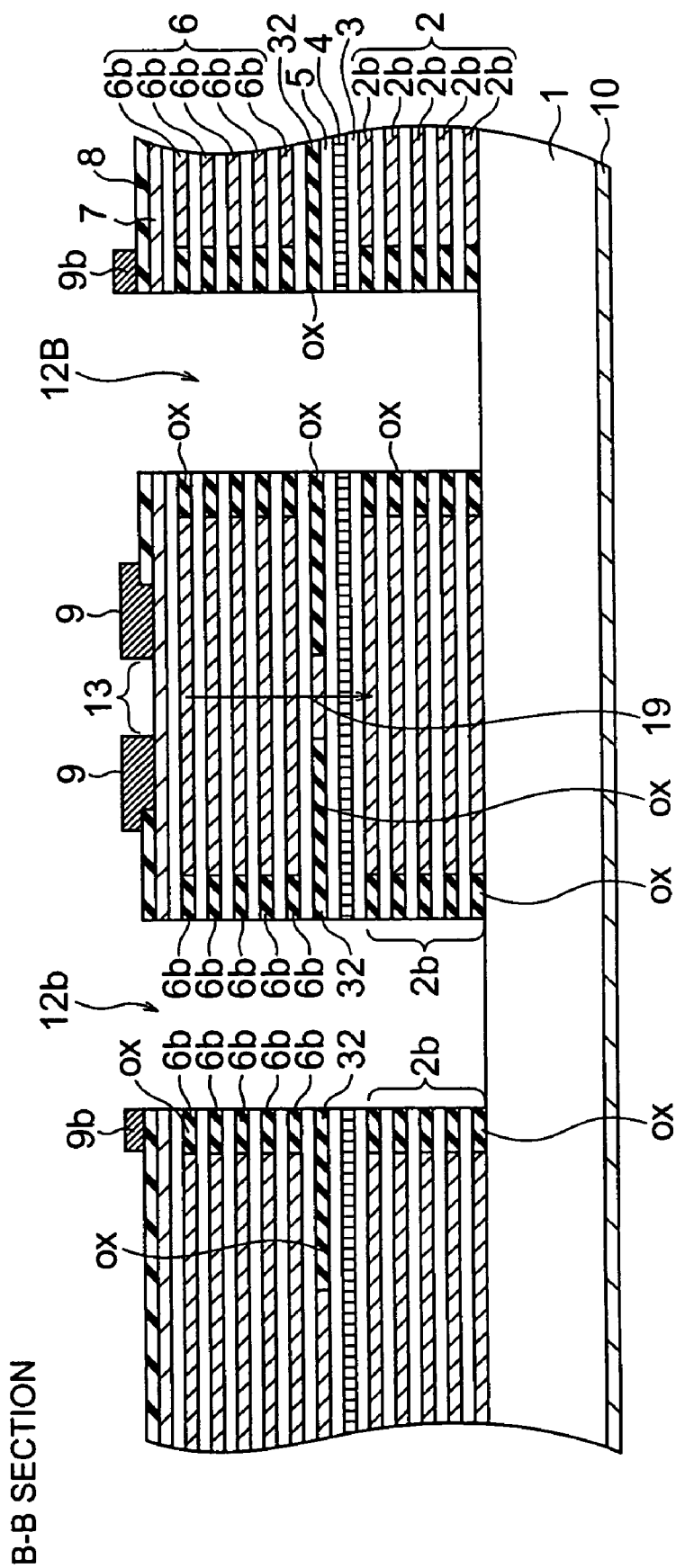
FIG. 11 is a sectional view of the VCSEL diode taken along line B-B shown in FIG. 9.

FIGS. 9 to 11 are illustrative views of a structure of a VCSEL diode as a third specific example of the embodiment, FIG. 9 being a top view thereof, FIG. 10 being a sectional view thereof taken along line A-A shown in FIG. 9, and FIG. 11 being a sectional view thereof taken along line B-B shown in FIG. 9. In these figures, constituent elements similar to those described regarding FIGS. 1 to 8 are denoted by similar reference numerals, and detailed explanation thereof will be omitted.

That is, in the specific example, an oxidized region OX was formed in only the upper layer to be oxidized 32. In this case, it was confirmed that the VCSEL diode could be produced by a method similar to the above-described method and excellent laser characteristics, polarization controllability, and beam shape controllability could be obtained. Here, an $Al_{0.98}Ga_{0.02}As$ layer was used as the layer to be oxidized 32 and formation of an oxidized region OX in the steam oxidation process was performed by a thermal treatment at a temperature of 420° C. A lateral oxidation rate of the $Al_{0.94}Ga_{0.06}As$ layer used for each of the Al high concentration layers 6b, 2b in the semiconductor multi-layered reflecting mirror is about ¼ of that of the $Al_{0.98}Ga_{0.02}As$ layer used for the layer to be oxidized 32 at the temperature of 420° C. Here, since a lateral oxidation length of the layer to be oxidized 32 was set to 20 μm for formation of the light emitting region 13, the lateral oxidation length of each Al high concentration layer 6b, 2b of the semiconductor multi-layered reflecting mirror in a lateral direction was 5 μm. At this time, asymmetry occurs in the compressive stress applied to the active layer 4 at the center of the mesa portion 100 due to utilization of different etching depths for mesa formation. A volume shrinkage due to the oxidation of the $Al_{0.94}Ga_{0.06}As$ layer of each Al high concentration layer 6b in the semiconductor multi-layered reflecting mirror is in a range of 7.5 to 8.5%. Assuming that the layer number of Al high concentration layers oxidized in the semiconductor multi-layered reflecting mirror is 10 regarding side walls of the regions 12a and 12b corresponding to different etching depths, stress in the order of several tens GPa is generated totally, and the stress or strain applied to the active layer 4 acts with a significantly different magnitude depending on a direction.

Stress occurring per one layer in the semiconductor multi-layered reflecting mirrors 6b and 2b is smaller than that in the layer to be oxidized 32 including Al with further high concentration and the oxidation region is separated further from the active layer of the light emitting region at the center of the mesa portion. As the structure shown in FIGS. 9 to 11, however, when a difference in the layer number of Al high concentration layers to be oxidized is large, a total stress becomes large, so that similar polarization controllability and beam shape controllability can be obtained.

SECOND EMBODIMENT

Figure 12:
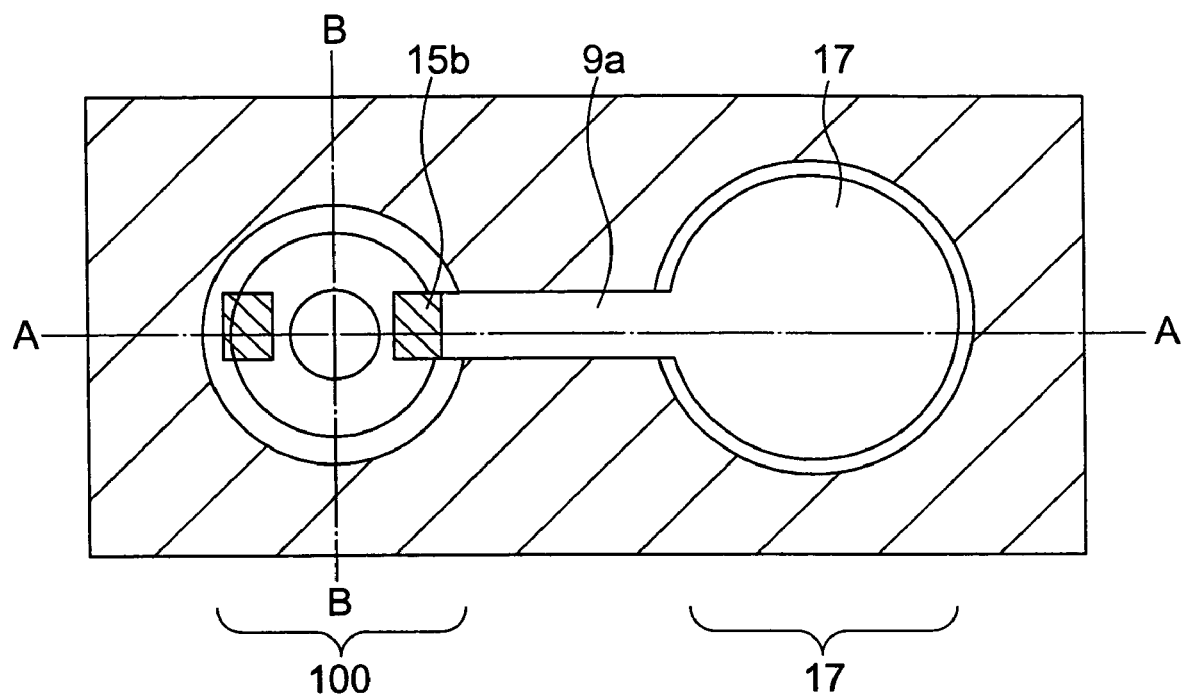
FIG. 12 is a top view of a VCSEL diode according to a second embodiment of the present invention.
Figure 13:
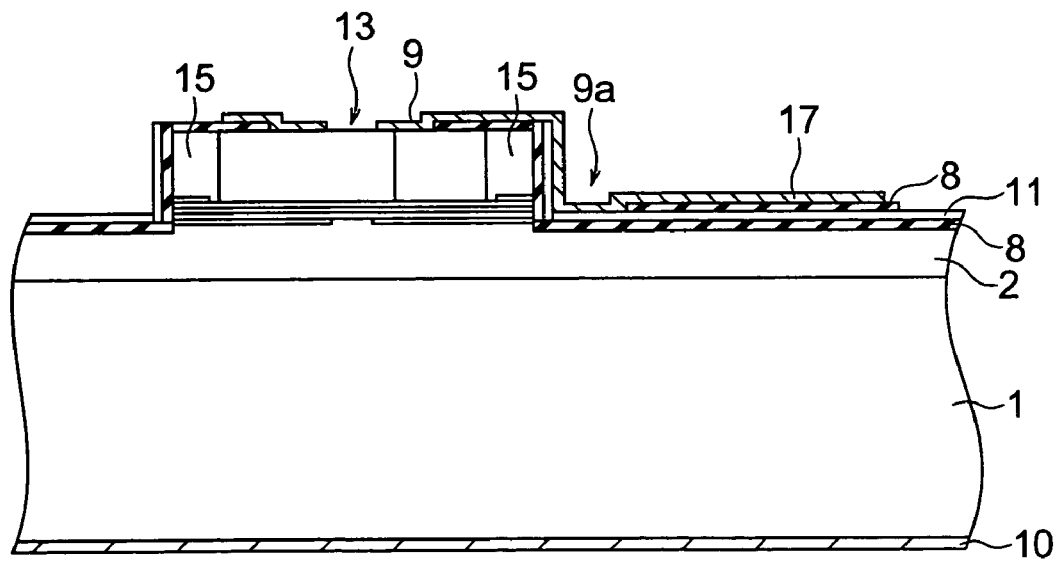
FIG. 13 is a sectional view of the VCSEL diode taken along line A-A shown in FIG. 12.
Figure 14:
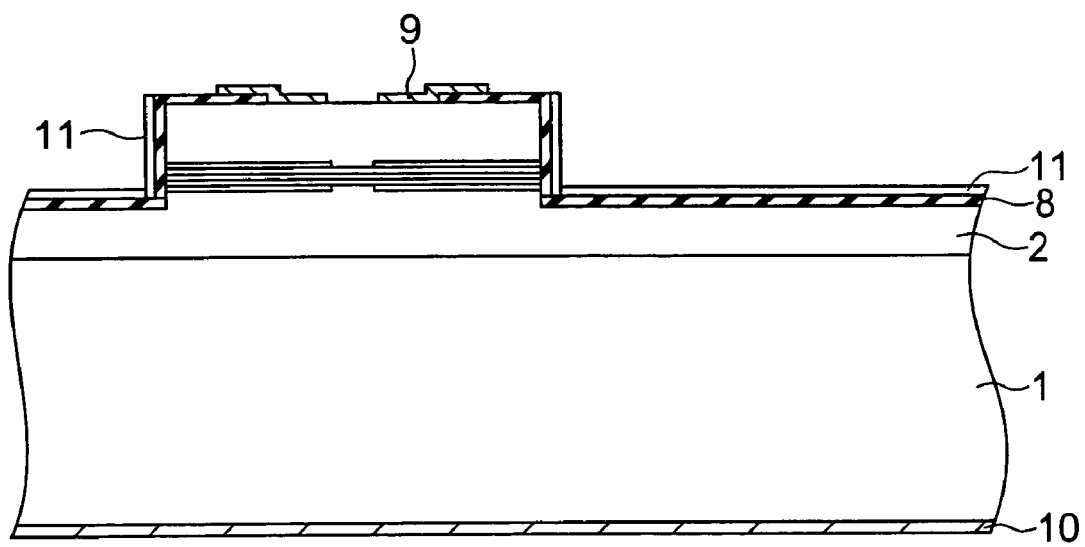
FIG. 14 is a sectional view of the VCSEL diode taken along line B-B shown in FIG. 12.
Figure 15:
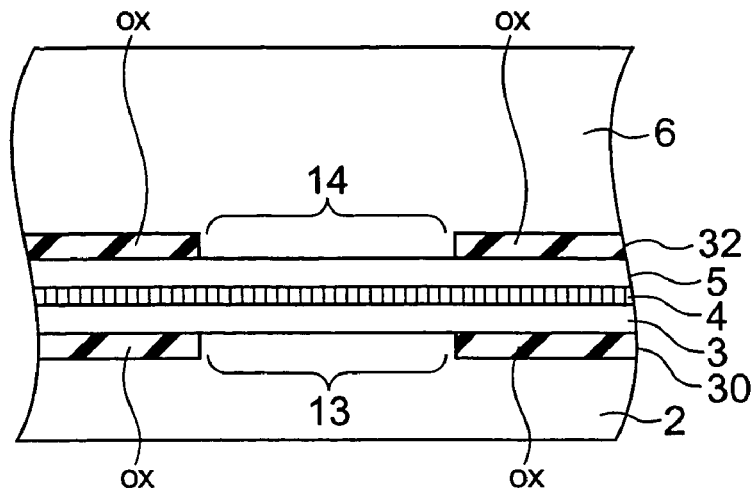
FIG. 15 is an enlarged sectional view of a mesa center portion shown in FIG. 14.

FIGS. 12 to 15 are illustrative views of a structure of a VCSEL diode device according to a second embodiment of the invention, FIG. 12 being a top view thereof, FIG. 13 being a sectional view thereof taken along line A-A shown in FIG. 12, and FIG. 14 being a sectional view thereof taken along line B-B shown in FIG. 12. FIG. 15 is an enlarged sectional view of a mesa central portion shown in FIG. 14. Here, a VCSEL diode will also be explained.

In a VCSEL diode of this embodiment, the semiconductor active layer 4, the first semiconductor multi-layered reflecting mirror 6 and the second semiconductor multi-layered reflecting mirror 2 are formed on the substrate 1 like the first embodiment. The first semiconductor multi-layered reflecting mirror 6 is provided on the opposite side of the semiconductor active layer 4 from the substrate 1. The second semiconductor multi-layered reflecting mirror 2 is provided on a side of the substrate 1 to the semiconductor active layer 4. The first and second semiconductor multi-layered reflecting mirrors 6 and 2 sandwiches the semiconductor active layer 4 to an optical cavity in a vertical direction to the substrate 1. The semiconductor cladding layer 5 and the semiconductor cladding layer 3 are respectively formed above and below the semiconductor active layer 4.

The contact layer 7 is formed on the first semiconductor multi-layered reflecting mirror 6, and the contact electrode 9 for injecting current into the light emitting region 13 is formed via the contact layer 7 and the first semiconductor multi-layered reflecting mirror 6. The contact electrode 9 is formed to open a top of the light emitting region 13.

The electrode 10 is formed on a back face of the substrate 1, and current is injected into the light emitting region 13 via the second semiconductor multi-layered reflecting mirror 2.

The first and second semiconductor multi-layered reflecting mirrors 6 and 2, the semiconductor active layer 4, the semiconductor cladding layer 3, and the semiconductor cladding layer 5 constitutes a projection-shaped mesa portion 100. An etching region 12 for mesa formation is provided around the mesa portion 100.

A current confinement portion is formed by oxidizing an upper layer to be oxidized 32 and a lower layer to be oxidized 30, each containing Al at a high concentration, below the first semiconductor multi-layered reflector mirror 6 above the second semiconductor multi-layered reflector mirror 2 from side walls of the mesa portion 100 toward the light emitting region 13 laterally. The current confinement portion is for confinement current flow into the light emitting region 13. Proton implantation regions 15 for controlling an oxidation rate are formed in the layer to be oxidized 32 positioned on an uppermost surface layer.

A polyimide 11 is formed on a surface of the etching region 12 for mesa formation, and a bonding pad 17 is formed via the polyimide 11. The bonding pad 17 is connected to the contact electrode 9 by a wire portion 9a.

As explained later in detail, since the VCSEL diode of the embodiment has the proton implantation regions 15, the oxidation rate can be largely reduced at the proton-implanted portion 15 of the layer to be oxidized 32 in proportion to a proton concentration, when the layer to be oxidized 32 is oxidized from the side wall of the mesa portion 100 to the light emitting region 13 laterally. By utilizing such a proton implantation effect, the oxidized regions OX for forming current confinement portion can be formed non-isotropically in the upper and lower layers 32 and 30 or only the lower layer 30, so that a compressive stress generated according to volume shrinkage due to oxidation of the layers to be oxidized is applied asymmetrically to the central portion of the semiconductor active layer 4 at the center of the mesa 100. Thereby, a VCSEL device with a high polarization controllability can be manufactured like the first embodiment.

Next, a method for manufacturing the VCSEL diode will be explained specifically.

An n-type semiconductor multi-layered reflecting mirror 2, a layer to be oxidized 30 forming a current confinement portion, a semiconductor cladding layer 3, a semiconductor active layer 4, a semiconductor cladding layer 5, a layer to be oxidized 32 forming the current confinement portion, a p-type semiconductor multi-layered reflecting mirror 6, and a contact layer 7 are sequentially grown on a cleaned n-type GaAs substrate 1 with a face orientation (100) having a thickness of 400 μm and a size of 3 square inches by using a MOCVD apparatus.

Assuming a structure that the semiconductor multi-layered reflecting mirrors 2 and 6 were arranged below and above the optical cavity constituted of the semiconductor active layer 4, the semiconductor cladding layer 3, and the semiconductor cladding layer 5 as a basic structure, design and manufacture were made as a GaInAsN VCSEL with 1.3 μm range emission wavelength.

The semiconductor multi-layered reflecting mirror 2 had such a stacked structure that n-type GaAs layers (high refractive index layers) and n-type $Al_yGa_{1-y}As$ (0<y<1) (low refractive index layers) were alternately stacked with a thickness of an optical wavelength ¼ to a wavelength 1.3 μm. In this embodiment, an $Al_{0.94}Ga_{0.06}As$ layer with Al composition of y=0.94 was used as the lower refractive index layer. Si was used as an n-type dopant for the semiconductor multi-layered reflecting mirror 2, where the dopant concentration was $2\times10^{18}/cm^3$.

The semiconductor cladding layer 3 was formed from n-type GaInR The semiconductor active layer 4 had such a quantum well structure that $Ga_xIn_{1-x}As_yN_{1-y}$ ($0 \leq x \leq 1$, $0 \leq y < 1$) layer adjusted so as to obtain a light emitting peak wavelength of 1.3 μm and a GaAs layer serving as a barrier layer were stacked alternately. Here, such a triple quantum well structure was employed that the GaAs layers serving as the barrier layers are stacked so as to sandwich the $Ga_xIn_{1-x}As_yN_{1-y}$ ($0 \leq x \leq 1$, $0 \leq y < 1$) layer from above and below. The In composition contained in the $Ga_xIn_{1-x}As_yN_{1-y}$ ($0 \leq x \leq 1$, $0 \leq y < 1$) quantum well layer 4 was in a range of 30% to 35%, the nitrogen composition therein was in a range of 0.5% to 1.0%, and the $Ga_xIn_{1-x}As_yN_{1-y}$ ($0 \leq x \leq 1$, $0 \leq y < 1$) quantum well layer 4 had a thickness of 7 nm. As the $Ga_xIn_{1-x}As_yN_{1-y}$ ($0 \leq x \leq 1$, $0 \leq y < 1$) layer, $Ga_{0.66}In_{0.34}As_{0.99}N_{0.01}$ of a composition which was controlled such that a lattice constant thereof was larger than that of the n-type GaAs substrate 1 and which had a compressive stress of about 2.5% was used. Therefore, a differential gain coefficient increased so that the threshold current value was further reduced, as compared with a non-stress case.

The semiconductor cladding layer 5 was formed of p-type GaInP. The semiconductor multi-layered reflecting mirror 6 had such a stacked structure that p-type GaAs layers (high refractive index layers) and p-type $Al_yGa_{1-y}As$ (0<y<1) (low refractive index layers) were alternately stacked with a thickness of an optical wavelength ¼ to a wavelength 1.3 μm. In this embodiment, an $Al_{0.94}Ga_{0.06}As$ layer with Al composition of y=0.94 was used as the lower refractive index layer like the n-type semiconductor multi-layered reflecting mirror 2. C (carbon) was used as p-type dopant for the semiconductor multi-layered reflecting mirror 6, where a dopant concentration was set in a range of $2\times10^{18}/cm^3$ (a portion in the vicinity of the quantum well layer 4) to $1\times10^{19}/cm^3$ (a portion in the vicinity of the contact layer 7).

The upper layer to be oxidized 32 and the lower layer to be oxidized 30 were respectively formed above the cladding layer 5 and below the cladding layer 3, and $Al_xGa_{1-x}As$ ($x \geqq 0.98$) whose Al composition ratio was larger than that of AlGaAs constituting the upper and lower semiconductor multi-layered reflecting mirror 6 and 2 was used as material for these layers. In this embodiment, AlAs was used as material for the layers to be oxidized 32 and 30.

The contact layer 7 was formed from p-type GaAs, where C (carbon) was used as p-type dopant and a dopant concentration was set to $2\times10^{19}/cm^3$.

Next, a $Si_3N_4$ film was formed as an etching mask film 8 for pattern formation and a pattern for the proton implantation region 15 was formed. Here, the pattern for the proton implantation region 15 for controlling selective oxidation was formed using the $Si_3N_4$ film 8 and resist as an implantation mask. Ion implantation was performed for forming the proton implantation region 15 under the condition of an acceleration voltage of 280 KeV and a dose amount of $4\times10^{13}/cm^2$ such that the proton concentration in the ion implantation region of the AlAs layer (a depth of 2.6 μm from the surface) constituting the layer to be oxidized 32 was $1\times10^{17}/cm^3$. The condition is a condition where $1\times10^{18}/cm^3$ which is the maximum concentration at the depth of 2.3 μm from the surface (which is positioned nearer to the surface than the layer to be oxidized 32 is), can be obtained and proton is hardly implanted into the AlAs layer (positioned at the depth of 3.0 μm from the surface) constituting the layer to be oxidized 30 below the active layer 4.

In the proton implantation condition, a concentration of proton introduced into the proton implantation region 15 is a concentration which does not cause a high resistance in the semiconductor layer but can block oxidation thereof effectively. It is preferable that the concentration of proton introduced in the proton implantation region 15 is, for example, $1\times10^{18}/cm^3$ or less.

Figure 16:
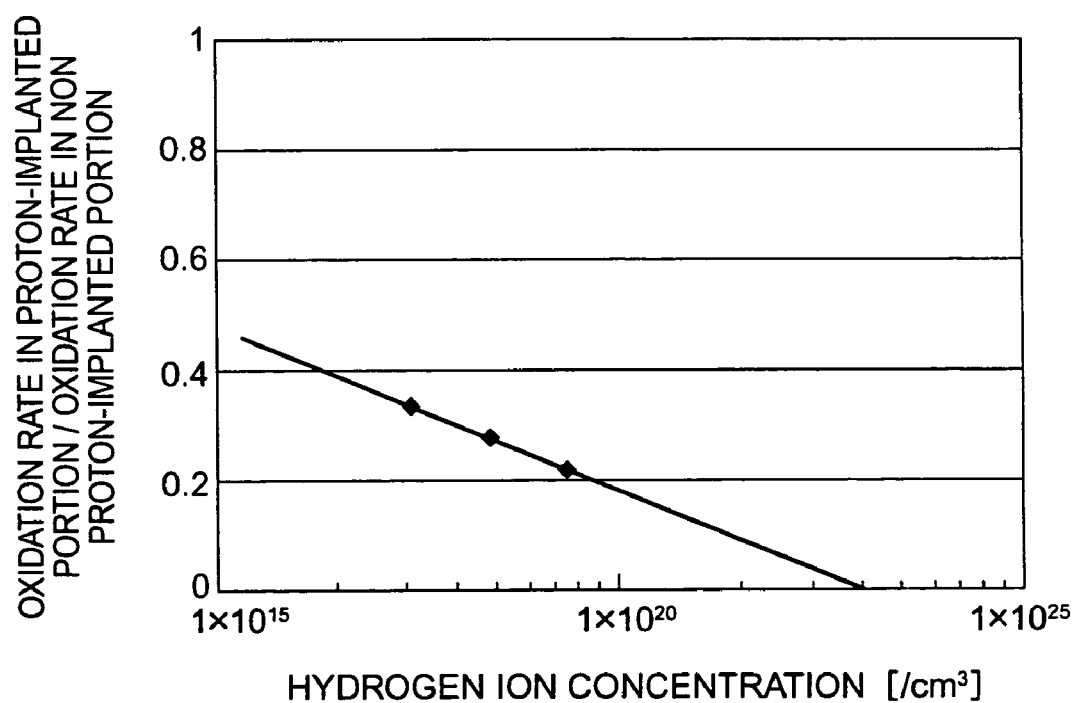
FIG. 16 is a graph diagram representing dependency of an oxidizing rate of an AlGaAs layer to a proton concentration.

FIG. 16 is a graph showing dependence of a lateral oxidation rate of an AlGaAs layer on a proton concentration. As understood from FIG. 16, the oxidation rate is reduced to about ⅓ at the proton concentration of $1\times10^{17}/cm^3$. Accordingly, the oxidation rate in the upper layer to be oxidized 32 is largely retarded so that the lateral oxidation length can be reduced to about ⅓ without increase of resistance of the device.

Next, a mesa portion is fabricated by etching down to the n-type semiconductor multi-layered reflecting mirror 2 using a mesa pattern formed on the etching mask film 8 formed by a similar photolithography step. The mesa pattern was etched in an ICP (Inductively Coupled Plasma) plasma dry etching apparatus using mixed gas of boron trichloride and nitrogen. At this time, a condition for the anisotropic etching is set by adjusting an antenna output, a bias output, and a substrate temperature. Here, etching was performed to obtain a cylindrical mesa with a diameter of 45 μm in order to manufacture a VCSEL having a circular opening 14 with a diameter of 5 μm.

Next, a thermal treatment at a temperature of 400° C. was performed in a steam atmosphere to selectively oxidize the layer to be oxidized 32 laterally, thereby forming a current confinement portion. At this time, a non-oxidized (light emitting) region 14 with a diameter of 5 μm was formed by setting the lateral oxidation length from the side wall to 20 μm. In the VCSEL diode with using non-off-angle substrate, the shape deforming (a size difference between the longitudinal size and the lateral size was 0.75 μm for the VCSEL diode with using off-angle substrate) was reduced to 0.1 μm.

Next, polyimide 11 was embedded into the mesa etching portion 12, so that the bonding pads 17 were formed. Next, the insulating mask film 8 on the p-type semiconductor multi-layered reflecting mirror 6 was removed so as to correspond to portions to be formed with wires and a light emitting opening, and a p-side electrode 9 was formed on the p-type GaAs contact layer 7. Simultaneously, a wire portion 9a was formed for connecting the bonding pad 17 and the p-side electrode 9, and an n-side electrode 10 was then formed on a back face of the substrate.

In the VCSEL thus produced, leak current was prevented owing to increase in resistance due to proton implantation below the wires. Owing to an effect of the highly strained active layer 4, continuous-wave oscillation in a single mode at room temperature with a low threshold current density could be obtained, and characteristics at a high temperature were excellent. In the fabricated VCSEL diode, control on polarized wave was made possible, and fluctuation of polarized wave or switching was prevented from occurring. According to this advantage, noises were reduced in the VCSEL, which could be used as an optical disc head or a communication device.

Like the above-described embodiment, the non-oxidized region 14 occurring due to anisotropic oxidation, and the size and shape of an emitted beam pattern were improved, so that a desired beam pattern size and shape could be obtained.

In this example, the concentration of proton implanted into the layer to be oxidized 32 was a concentration of $1\times10^{17}/cm^3$. However, it is apparent that, even if proton of a concentration higher or lower than the concentration of $1\times10^{17}/cm^3$, similar effect can be obtained. Implantation of proton with a high concentration is desirable, because the oxidation rate of the layer to be oxidized 32 containing Al at a high concentration is significantly lowered and that progress of oxidation can be suppressed at a desired position so that controllability to oxidation length or oxidation shape can be improved. On the other hand, implantation of proton with a concentration higher than the dopant concentration in the semiconductor multi-layered reflecting mirrors 2, 6 increases resistance in the implanted region, which results in difficulty in current flow. Therefore, it is necessary to devise the proton implantation region and the position of the upper electrode so as to allow easy flow of current into a current concentration portion obtained due to selective oxidation to narrow the current.

In this example, the AlAs layers were used for the layers to be oxidized 32 and 30 for current confinement portion formation. However, similar effect or advantage can be achieved even when $Al_xGa_{1-x}As$ ($x \geqq 0.95$) with a high Al composition ratio is used. When the Al composition ratio is increased, oxidation rate in the steam oxidation step becomes faster, which allows shortening of a step time, and an amount of generation of stress/strain due to oxidation is increased, which is suitable for improvement in mass productivity for a device or polarization controllability.

THIRD EMBODIMENT

Next, a third embodiment of the present invention will be explained.

Figure 17:
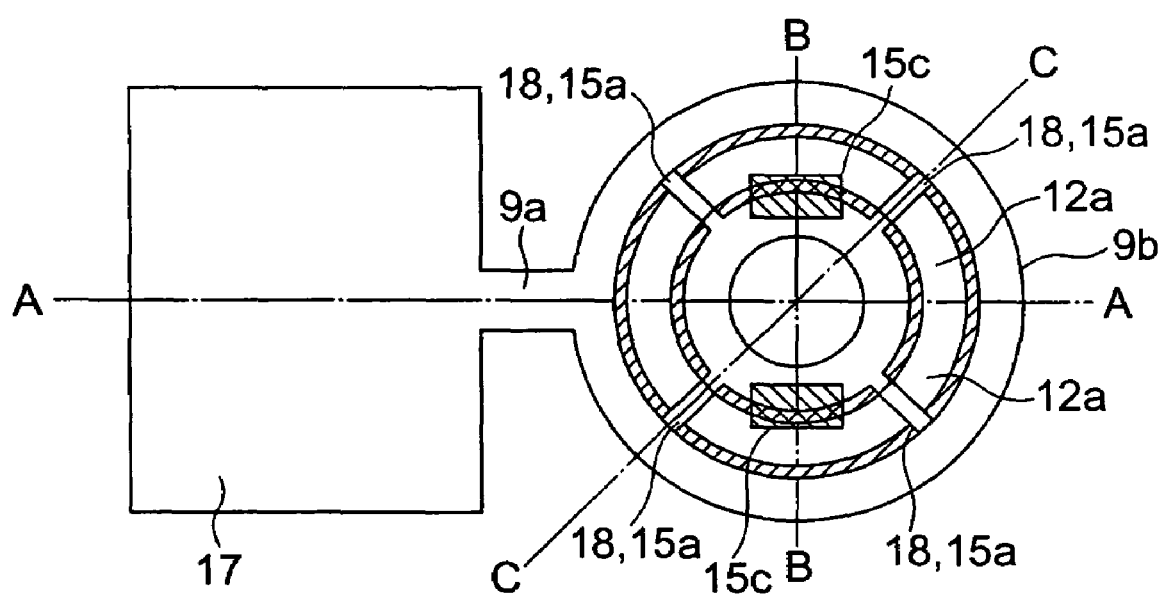
FIG. 17 is a plan view of a VCSEL diode according to a third embodiment of the present invention.
Figure 18:
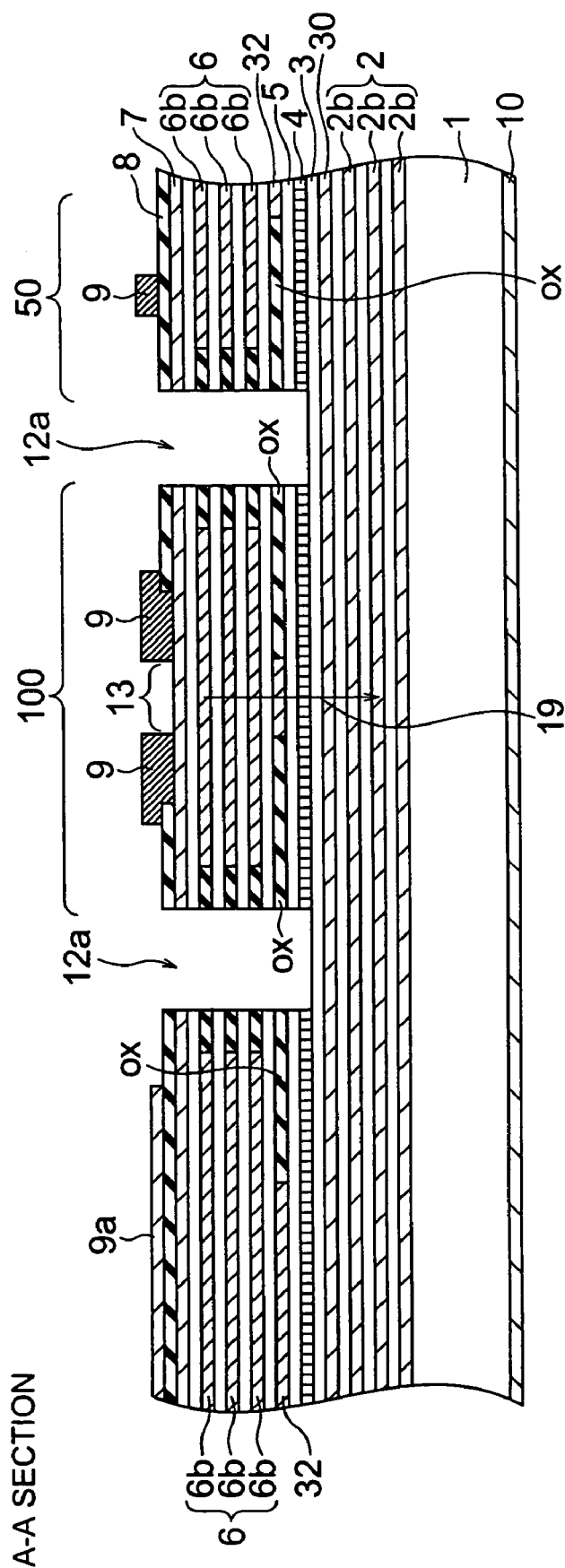
FIG. 18 is a sectional view of the VCSEL diode taken along line A-A shown in FIG. 17.
Figure 19:
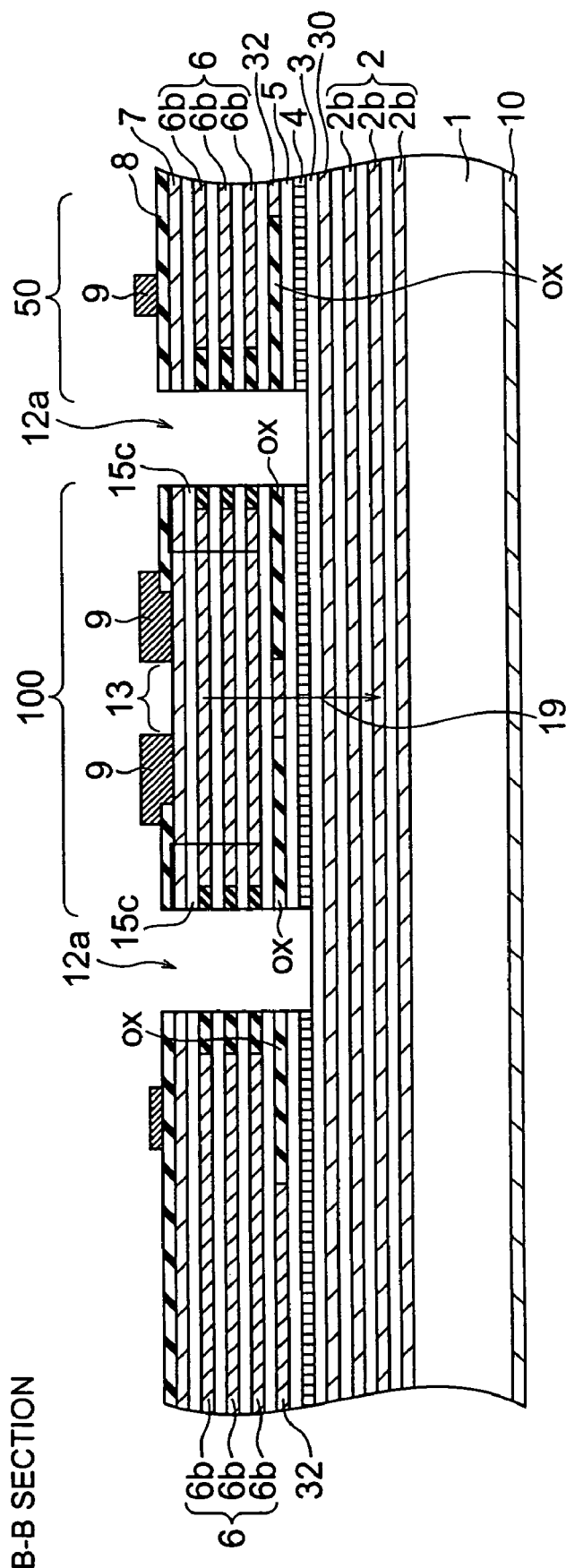
FIG. 19 is a sectional view of the VCSEL diode taken along line B-B shown in FIG. 17.
Figure 20:
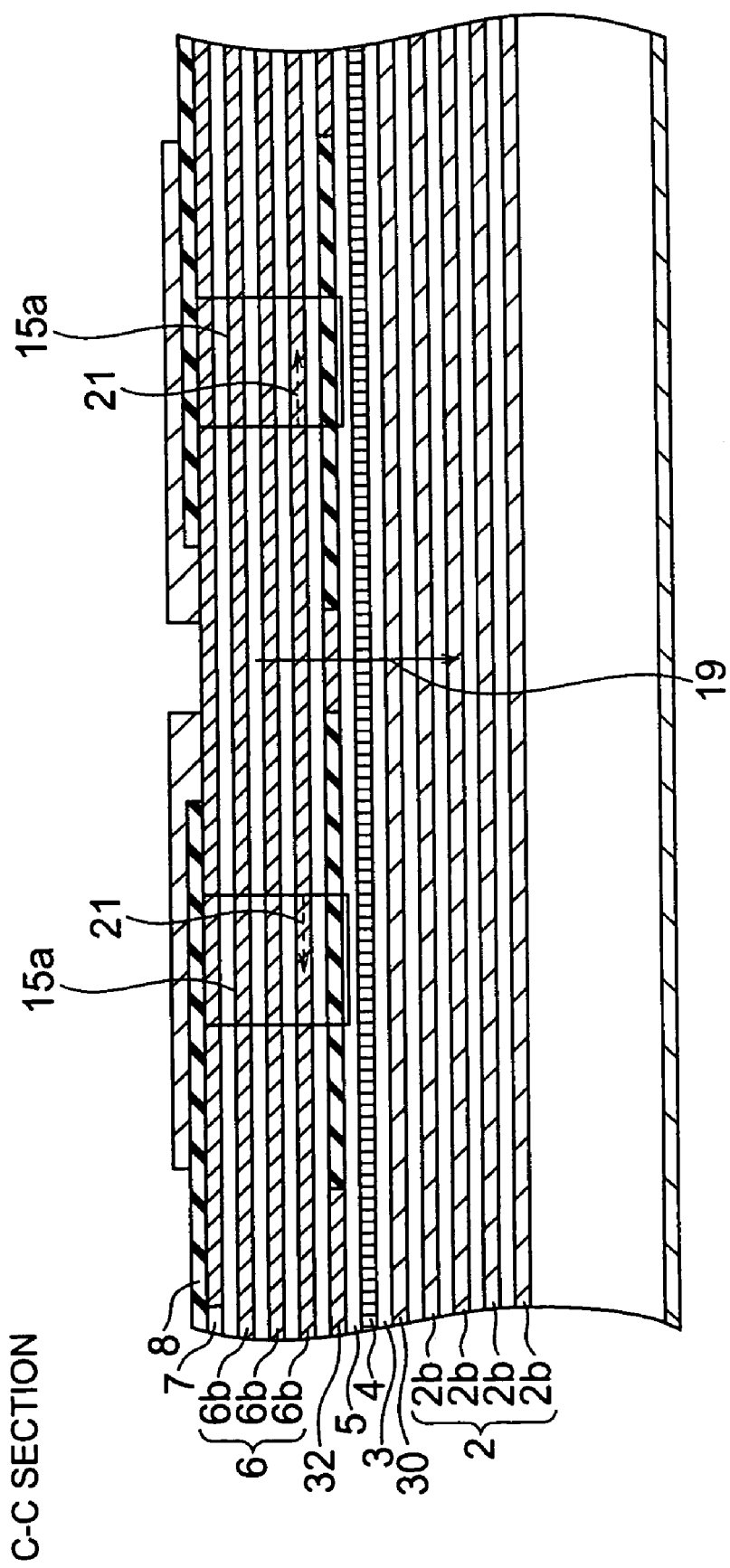
FIG. 20 is a sectional view of the VCSEL diode taken along line C-C shown in FIG. 17.
Figure 21A:
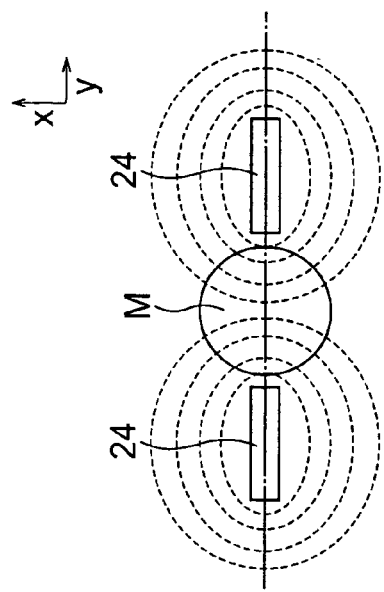
FIGS. 21A to 21D are illustrative diagrams showing a specific example where stress adding regions 24 are provided about a peripheral portion of a mesa.
Figure 21C:
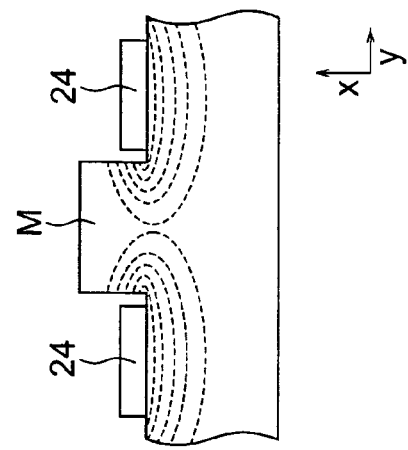
Figure 21B:
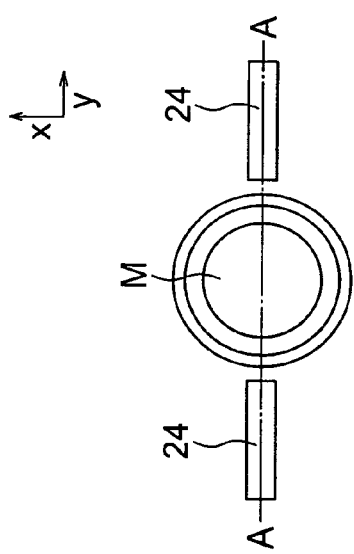
Figure 21D:
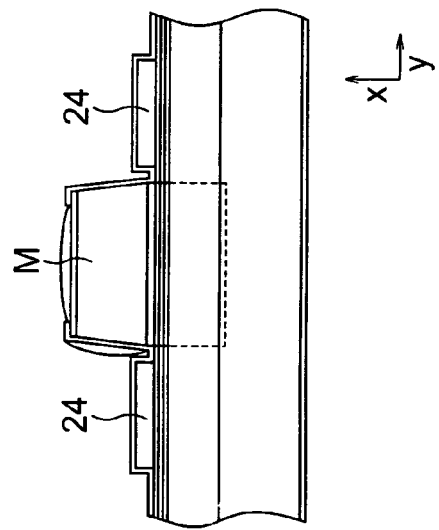
Figure 22:
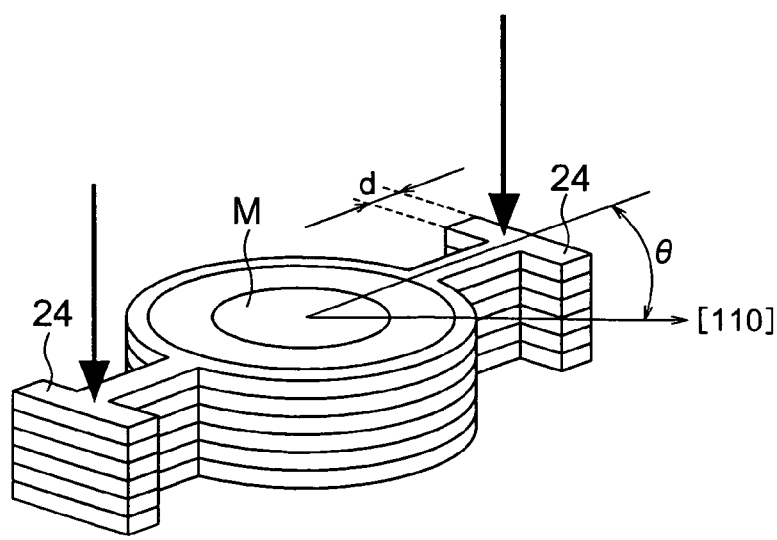
FIG. 22 is an illustrative view showing a specific example where T-shaped projection shapes 24 are added to a cylindrical mesa shape.
Figure 23:
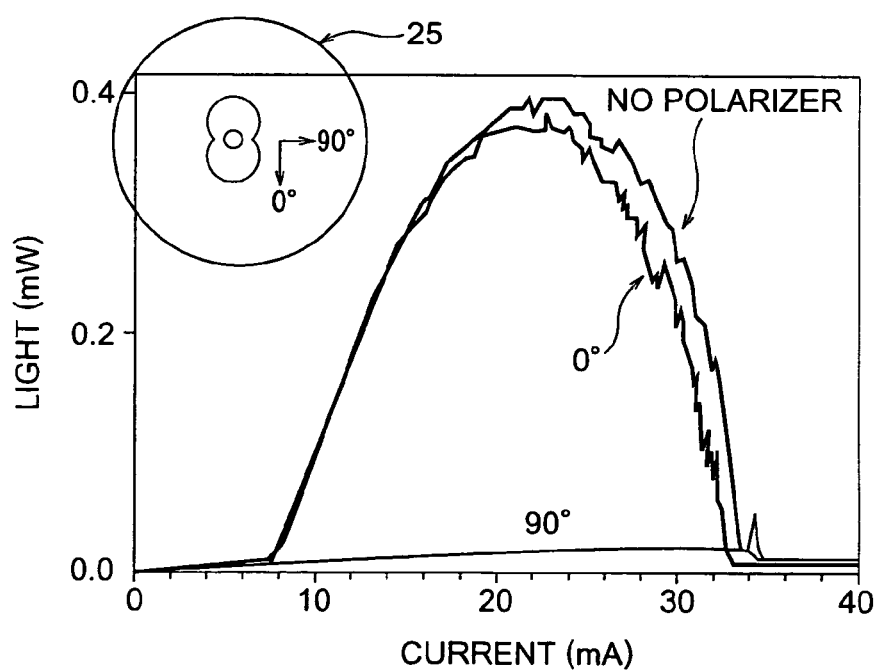
FIG. 23 is an illustrative view showing a dumbbell type mesa structure 25.

FIGS. 17 to 20 are illustrative views of a VCSEL diode according to a third embodiment of the invention, FIG. 17 being a plan view thereof, FIG. 18 being a sectional view thereof taken along line A-A shown in FIG. 17, and FIG. 19 being a sectional view thereof taken along line B-B shown in FIG. 17, and FIG. 20 being a sectional view thereof taken along line C-C shown in FIG. 17. In these figures, constituent elements similar to those described regarding FIGS. 1 to 16 are denoted by similar reference numerals, and detailed explanation thereof will be omitted.

A current confinement portion is formed by oxidizing the layer to be oxidized 32 containing Al at a high concentration below the first semiconductor multi-layered reflecting mirror 6 from the side wall of the mesa portion 100 toward the light emitting region 13 laterally. The current confinement portion is for confinement current into the light emitting region 13.

A proton implantation region 15 for controlling oxidation rate is formed in the first semiconductor multi-layered reflecting mirror 6. Thereby, when the Al high concentration layers 6b constituting the first semiconductor multi-layered reflecting mirror 6 is laterally oxidized at steam oxidation process, the oxidation rate in the proton implantation region 15 is largely retarded in proportion to the proton concentration. The oxidation length from the side face of the recessed portion becomes short in the proton implantation region 15, a stress in the proton implantation region 15 is smaller than that in the Al high concentration layer 6b of the semiconductor multi-layered reflecting mirror with a long oxidation length (where proton has not been implanted), which results in anisotropy (asymmetry) in application of stress to the semiconductor active layer at the center of the mesa. The device of the present invention utilizing such a fact has a feature that polarization controllability is improved like the first and second embodiments. Further, since such a device can be manufactured easily, a mass productivity for a VCSEL device with a high performance will be improved.

Next, a method for manufacturing the VCSEL diode will be explained specifically.

An n-type semiconductor multi-layered reflecting mirror 2, a semiconductor cladding layer 3, a semiconductor active layer 4, a semiconductor cladding layer 5, a layer to be oxidized 32 forming the current confinement portion, a p-type semiconductor multi-layered reflecting mirror 6, and a contact layer 7 are sequentially grown on a cleaned n-type GaAs substrate 1 with a (100)-oriented plane having a thickness of 400 µm and a size of 3 square inches by using a MOCVD apparatus.

Assuming a structure that the semiconductor multi-layered reflecting mirrors 2 and 6 were arranged below and above the optical cavity constituted of the semiconductor active layer 4, the semiconductor cladding layer 3, and the semiconductor cladding layer 5 as a basic structure, design and manufacture were made so as to obtain optimal characteristics as a GaIn AsN VCSEL with 1.3 µm range emission wavelength.

The semiconductor multi-layered reflecting mirror 2 had such a stacked structure that n-type GaAs layers (high refractive index layers) and n-type $Al_yGa_{1-y}As$ (0<y<1) (low refractive index layers) were alternately stacked with a thickness of an optical wavelength ¼ to a wavelength 1.3 µm. In this embodiment, an $Al_{0.94}Ga_{0.06}As$ layer with Al composition of y=0.94 was used as the lower refractive index layer. Si was used as an n-type dopant for the semiconductor multi-layered reflecting mirror 2, where the dopant concentration was $2\times10^{18}/cm^3$.

The semiconductor cladding layer 3 was formed from n-type GaInP.

The semiconductor active layer 4 had such a quantum well structure that $Ga_xIn_{1-x}As_yN_{1-y}$ ($0\leq x\leq 1$, $0\leq y<1$) layer adjusted so as obtain a light emitting peak wavelength of 1.3 µm and a GaAs layer serving as a barrier layer were stacked alternately. Here, such a triple quantum well structure was employed that the GaAs layers serving as the barrier layers are stacked so as to sandwich the $Ga_xIn_{1-x}As_yN_{1-y}$ ($0\leq x\leq 1$, $0\leq y<1$) layer from above and below. The In composition contained in the $Ga_xIn_{1-x}As_yN_{1-y}$ ($0\leq x\leq 1$, $0\leq y<1$) quantum well layer was in a range of 30% to 35%, the nitrogen composition therein was in a range of 0.5% to 1.0%, and the $Ga_xIn_{1-x}As_yN_{1-y}$ ($0\leq x\leq 1$, $0\leq y<1$) quantum well layer had a thickness of 7 nm. As the $Ga_xIn_{1-x}As_yN_{1-y}$ ($0\leq x\leq 1$, $0\leq y<1$) quantum well layer, $Ga_{0.66}In_{0.34}As_{0.99}N_{0.01}$ of a composition which was controlled such that a lattice constant thereof was larger than that of the n-type GaAs substrate 1 and which had a compressive stress of about 2.5% was used. Therefore, a differential gain coefficient increased so that the threshold current value was further reduced, as compared with a non-stress case.

The semiconductor cladding layer 5 was formed of p-type GaInp. The semiconductor multi-layered reflecting mirror 6 had such a stacked structure that p-type GaAs layers (high refractive index layers) and p-type $Al_yGa_{1-y}As$ (0<y<1) (low refractive index layers) were alternately stacked with a thickness of an optical wavelength ¼ to a wavelength 1.3 µm. In this embodiment, an $Al_{0.94}Ga_{0.06}As$ layer with Al composition of y=0.94 was used as the lower refractive index layer like the n-type semiconductor multi-layered reflecting mirror 2. C (carbon) was used as p-type dopant for the semiconductor multi-layered reflecting mirror 6, where a dopant concentration was set in a range of $2\times10^{18}/cm^3$ (a portion in the vicinity of the quantum well layer 4) to $1\times10^{19}/cm^3$ (a portion in the vicinity of the contact layer 7).

The upper layer to be oxidized 32 and the lower layer to be oxidized 30 were respectively formed above the cladding layer 5 and below the cladding layer 3, and $Al_xGa_{1-x}As$ ($x\geq 0.98$) whose Al composition ratio was larger than that of AlGaAs constituting the upper and lower semiconductor multi-layered reflecting mirror 6 and 2 was used as material for these layers. In this embodiment, $Al_xGa_{1-x}As$ (x=0.98) was used as material for the layers to be oxidized 32 and 30.

The contact layer 7 was formed from p-type GaAs, where C (carbon) was used as p-type dopant and a dopant concentration was set to $2\times10^{19}/cm^3$.

Next, a $Si_3N_4$ film was formed as an etching mask film 8 for pattern formation. Here, a pattern for isolation 15a and a pattern for selective oxidation control 15c were formed using the $Si_3N_4$ film 8 and resist as an implantation mask. Next, a high resistance region 15a was formed in the pattern portion for isolation 15a by irradiating proton at acceleration voltages of 100, 200 and 300 kev in a dose amount of $1\times10^{15}/cm^2$ to implant proton. Proton was uniformly distributed in a region in depth from 0.5 to 2.5 µm by the proton implantation, so that a high resistance region was formed down to the vicinity of a depth of about 4 µm (the depth from the surface to the active layer was 2.8 µm in this example).

Ion implantation was performed in the proton implantation region 15c for a high Al concentration layer of the semiconductor multi-layer under the condition of an acceleration voltage of 200 keV and a dose amount of $3\times10^{13}/cm^2$. This is a condition for achieving the maximum concentration of $1\times10^{18}/cm^3$ at a depth of 1.5 µm from the surface, and a portion in a depth range of 1 to 2 µm from the surface is region meeting the proton concentration of $1\times10^{16}/cm^3$ or more. Proton is not implanted in the $Al_{0.98}Ga_{0.02}As$ layer (the depth of 2.6 µm from the surface) of the layer to be oxidized 32. The implantation region is not made high resistant under the condition. As understood from a dependence of an oxidation rate of the AlGaAs layer on a proton concentration shown in FIG. 16, the oxidation rate is reduced to about ⅓ at the proton concentration of $1 \times 10^{17}/\text{cm}^3$. Therefore, in the Al high concentration layer 6b of the semiconductor multi-layered reflecting mirror implanted with proton, the oxidation rate in a steam oxidation step is considerably retarded, and the oxidation length can be reduced to about ⅓ without increasing a device resistance.

Next, a mesa portion is fabricated by etching down to an upper portion of the n-type semiconductor multi-layered reflecting mirror 2 using a mesa pattern formed on the etching mask film formed by a similar photolithography process. The mesa pattern was etched in an ICP (Inductively Coupled Plasma) plasma dry etching apparatus using mixed gas of boron trichloride and nitrogen. At this time, a condition for causing anisotropic etching is set by adjusting an antenna output, a bias output, and a substrate temperature. Here, etching was performed to obtain a cylindrical mesa with a diameter of 45 μm in order to manufacture a VCSEL having a circular opening with a diameter of 5 μm.

Next, a thermal treatment at a temperature of 420° C. was performed in a steam atmosphere to selectively oxidize the layer to be oxidized 32 laterally, thereby forming a current confinement portion. At a substrate temperature of 420° C., the oxidation rate of each $Al_{0.94}Ga_{0.06}As$ layer in the semiconductor multi-layered reflecting layer (in which proton was not implanted) is about ¼ the $Al_{0.98}Ga_{0.02}As$ layer which is the layer to be oxidized. Here, since the oxidation length of the layer to be oxidized 32 is set to 20 μm for forming a current confinement portion, the lateral oxidation length of each Al high concentration layer 6b of the semiconductor multi-layered reflecting mirror where proton was not implanted was 5 μm. On the other hand, the lateral oxidation length in a region in which proton was implanted was as short as 1.7 μm, which was about ⅓ of 5 μm. With such a constitution, asymmetry occurred in a compressive stress applied to the active layer at the central portion of the mesa portion 100.

The volume shrinkage due to oxidation of each $Al_{0.94}Ga_{0.06}As$ layer in each Al high concentration layer 6b of the semiconductor multi-layered reflecting mirror was in a range of 7.5 to 8.5%. The layer number of semiconductor multi-layered reflecting mirrors to be implanted with proton was 10, stress in the order of several tens GPa occurred totally. Further, since the magnitude of the stress or strain applied to the active layer decreased in inverse proportion to a distance between the active layer center and the layer to be oxidized, the compressive stress applied to the active layer resulted in a large difference depending on a direction. When the non-oxidized (light emitting) region 14 with a diameter of 5 μm was produced by setting the oxidation length from the side face to 20 μm, the deformed shape (a size difference between the vertical size and the horizontal size was 0.75 μm) occurred with the VCSEL using off-angle substrate (10° off) in the direction of the off angle was reduced to 0.1 μm with the VCSEL using (100)-oriented substrate.

Next, a bonding pad 17 and a p-side electrode 9 on the p-type GaAs contact layer 7 were formed. At this time, a wire portion 9a was simultaneously formed for connecting the bonding pad 17 and the p-side electrode 9. Next, an n-side electrode 10 was formed on a back face of the substrate so that a main portion of the device was completed.

In the VCSEL thus produced, leak current was prevented owing to increase in resistance due to proton implantation below the wires. Owing to an effect of the highly strained active layer 4, continuous-wave oscillation in a single mode at room temperature with a low threshold current density could be obtained, and characteristics at a high temperature were excellent. In the fabricated VCSEL, control on polarized wave was made possible, and fluctuation of polarized wave or switching was prevented from occurring. According to this advantage, noises were reduced in the VCSEL, which could be used as an optical disc head or a communication device.

In the device of the present invention, since the contact electrode, the peripheral electrode, and the wire connecting these electrodes are formed on substantially the same level, which results in structure which does not require a planarization process, such a merit as prevention of "breaking due to step" of a wire can be obtained.

The explanation about the case that the layer to be oxidized 32 is constituted of one layer has been made, but similar effect can be obtained even when the layer 32 is constituted of a plurality of layers. $Al_xGa_{1-x}As$ (x≧0.98) with an Al composition larger ratio than that of AlGaAs constituting the semiconductor multi-layered reflecting mirror 2, which is formed below the cladding layer 3, may be used as the layer to be oxidized. In this case, since the layer to be oxidized is positioned at a deep portion from the surface, such a merit can be obtained that the $Al_xGa_{1-x}As$ (x≧0.98) is not influenced by proton implantation so much.

In this embodiment, the concentration of proton to be implanted was $1 \times 10^{17}/\text{cm}^3$. However, it is apparent that similar merit can be obtained even if proton with a concentration higher or lower than the concentration in the embodiment is used. When proton with a high concentration is implanted, the oxidation rate of each Al high concentration layer 6b in the semiconductor multi-layered reflecting mirror, which includes Al at a high concentration is significantly lowered and the lateral oxidation can be suppressed at a desired position, which improves controllability on lateral oxidation length or oxide aperture shape. On the other hand, when proton is implanted with a concentration higher than the dopant concentration in the semiconductor multi-layered reflector mirror, 2, 6, a region in which the proton has been implanted increase in resistance, which makes current flow difficult. Therefore, it will be necessary to devise positions of the implantation region and the upper electrode in order to narrow current so as to facilitate current flow to flow into the current concentration portion formed by performing selective oxidation.

In the specific example, the $Al_{0.98}Ga_{0.02}As$ layer was used as the layer to be oxidized 32 for forming current confinement portion. However, it will be apparent that, even if an AlAs layer with a high Al composition ratio or an $Al_xGa_{1-x}As$ layer (x≧0.95) is used, similar effect or advantage to the other examples can be obtained.

The embodiments of the present invention have been explained with reference to the specific examples. However, the present invention is not limited to these embodiments. For example, in the above specific examples, explanation has been made using $Ga_xIn_{1-x}As_yN_{1-y}$ (0≦x≦1, 0≦y≦1) as the active layer 4, but the present invention is not limited to this material. In this invention, various materials such as InGaAlP base material, AlGaAs base material or InGaAsP base material can be used for the active layer 4.

Various materials can be used for the cladding layers 4 and 5, or the semiconductor multi-layered reflecting layers 2 and 6. For example, each of the semiconductor multi-layered reflecting mirrors 2 and 6 is not limited to the stacked structure of the AlGaAs layer and the GaAs layer, but it may has a stacked structure of a material with a large refractive index and a material a small refractive index which do not contain Al. Such a combination as GaInP/GaAs, GaInPAs/GaAs, GaInP/GaInAs, GaInP/GaPAs, GaInP/GaInAs or GaP/GaInAsN can be used for each of the semiconductor multi-layered reflecting mirrors 2 and 6.

Each of the upper and lower layers to be oxidized 32 and 30 may be constituted of one layer, and at least one thereof may be constituted of a plurality of layers. For example, when the upper layer to be oxidized is constituted of two layers and the lower layer to be oxidized is constituted of one layer, asymmetry of compressive stress applied to the semiconductor active layer 4 is made more significant, which can result in further improvement in polarization controllability.

As the growth process, a MBE (molecular beam epitaxy) process or the like can be used. In the above examples, the triple quantum well structure has been used as the stacked structure, but a structure using another quantum well may be used for the stacked structure.

In the examples, explanation has been made using the circular shape and the square shape as the shape of the desired opening. However, it will be apparent that the advantage or merit of the present invention can be achieved even when a rectangular shape or an oval shape is used as the shape of the opening.

As explained above, according to each embodiment of the present invention, even when the VCSEL diode of the selective oxidation type is produced on a non-off-angle substrate with (100)-oriented plane or the like, a high performance VCSEL diode with excellent controllability to polarization mode and/or high mass productivity and a method for manufacturing the same can be provided.

In addition, all VCSEL diodes and a method for manufacturing them which can be properly modified or implemented by those skilled in the art based upon the VCSEL diodes and the methods for manufacturing them described above as the embodiments of the present invention belong to the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A vertical cavity surface emitting laser diode, comprising:
    a substrate;
    a semiconductor active layer which is formed on a principal face of the substrate and has a light emitting region;
    a first semiconductor multi-layered reflecting mirror and a second semiconductor multi-layered reflecting mirror which sandwich the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer;
    a pair of electrodes configured to inject current into the semiconductor active layer;
    a current confinement portion which is formed in the vicinity of the semiconductor active layer and has a plurality of layers to be oxidized including Al;
    a recessed portion which has a groove depth reaching at least the uppermost layer of the layers to be oxidized; and
    a mesa portion which is surrounded by the recess portion, the current confinement portion including first and second current confinement portions, the first current confinement portion having a first number of layers to be oxidized having side portions which have been oxidized and the second current confinement portion having a second number of layers to be oxidized having side portions which have been oxidized, the first number being different from the second number, and the first and second current confinement portions being arranged so as to be substantially orthogonal to each other.

2. A vertical cavity surface emitting laser diode according to claim 1, wherein the recessed portion has a first recessed portion adjacent to the first current confinement portion and a second recessed portion adjacent to the second current confinement portion,
    the first recessed portion has a first groove depth such that a bottom thereof reaches oxidized portions of the layers to be oxidized of the first current confinement portion, and
    the second recessed portion has a second groove depth different from the first groove depth and such that a bottom thereof reaches oxidized portions of the layers to be oxidized of the second current confinement portion.

3. A vertical cavity surface emitting laser diode according to claim 2, wherein the first and second recessed portions are arranged so as to be substantially orthogonal to each other.

4. A vertical cavity surface emitting laser diode according to claim 1, wherein non-oxidized portions of the layers to be oxidized adjacent to oxidized portions thereof contain proton with a concentration higher than that in the oxidized portions.

5. A vertical cavity surface emitting laser diode according to claim 1, wherein the first and second current confinement portions are provided between the first and second semiconductor multi-layered reflecting mirrors.

6. A vertical cavity surface emitting laser diode according to claim 1, wherein a side portion of the first semiconductor multi-layered reflecting mirror is oxidized.

7. A vertical cavity surface emitting laser diode, comprising:
    a substrate;
    a semiconductor active layer which is formed on a principal face of the substrate and has a light emitting region;
    a first semiconductor multi-layered reflecting mirror and a second semiconductor multi-layered reflecting mirror which sandwich the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer;
    a pair of electrodes configured to inject current into the semiconductor active layer;
    a current confinement portion which is formed between the first and second semiconductor multi-layered reflecting mirrors and has a layer to be oxidized including Al;
    a first recessed portion which has a groove depth such that a bottom thereof reaches the layer to be oxidized;
    a second recessed portion which has a groove depth such that a bottom thereof reaches the lowermost layer of the second semiconductor multi-layered reflecting mirror, the first and second recessed portions being arranged so as to be substantially orthogonal to each other; and
a mesa portion which is surrounded by the first and second recessed portions,
a side portion of the first semiconductor multi-layered reflecting mirror being oxidized at the first recessed portion and a side portion of the second semiconductor multi-layered reflecting mirror being oxidized at the second recessed portion.

8. A vertical cavity surface emitting laser diode, comprising:
   a substrate;
   a semiconductor active layer which is formed on a principal face of the substrate and has a light emitting region;
   a first semiconductor multi-layered reflecting mirror and a second semiconductor multi-layered reflecting mirror which sandwich the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer;
   a pair of electrodes configured to inject current into the semiconductor active layer;
   a current confinement portion which is formed in the vicinity of the semiconductor active layer and has a layer to be oxidized including Al, a side portion of the layer to be oxidized being oxidized and a central portion thereof being non-oxidized;
   a recessed portion which has a groove depth such that a bottom thereof reaches at least the uppermost layer of the layer to be oxidized;
   a mesa portion which is surrounded by the recessed portion,
   the current confinement portion including a first region where the side portion of the layer to be oxidized has been oxidized, and a second region where the side portion of the layer to be oxidized has been oxidized, an oxidized length of the side portion of the first region being different from that of the second region, the first and second regions being arranged so as to be substantially orthogonal to each other.

9. A vertical cavity surface emitting laser diode according to claim 8, wherein the first region contains proton with a concentration higher than that of the second region.

10. A vertical cavity surface emitting laser diode according to claim 8, wherein the current confinement portion has a plurality of the layers to be oxidized so as to sandwich the semiconductor active layer.

11. A vertical cavity surface emitting laser diode according to claim 10, wherein a cladding layer is provided between the current confinement portion and the semiconductor active layer.

12. A vertical cavity surface emitting laser diode, comprising:
   a substrate;
   a semiconductor active layer which is formed on a principal face of the substrate and has a light emitting region;
   a first semiconductor multi-layered reflecting mirror and a second semiconductor multi-layered reflecting mirror which sandwiches the semiconductor active layer to form an optical cavity in a direction perpendicular to the substrate, the first semiconductor multi-layered reflecting mirror being formed on an opposite side of the semiconductor active layer from the substrate and the second semiconductor multi-layered reflecting mirror being formed on a side of the substrate to the semiconductor active layer;
   a pair of electrodes configured to inject current into the semiconductor active layer;
   a current confinement portion which is formed in the vicinity of the semiconductor active layer and has a plurality of layers to be oxidized including Al, side portions of the layers to be oxidized being oxidized and a central portion thereof being non-oxidized;
   a recessed portion which has a groove depth reaching at least the uppermost layer of the layers to be oxidized; and
   a mesa portion which is surrounded by the recessed portion,
   at least one of the first and second semiconductor multi-layered reflecting mirrors having an oxidized region formed by oxidation from an end face thereof, and the oxidized region having a first portion where oxidation length from the end face is short and a second portion where oxidation length from the end face is longer than that of the first portion, the first and second portions being arranged so as to be substantially orthogonal to each other.

13. A vertical cavity surface emitting laser diode according to claim 12, wherein a non-oxidized region adjacent to the oxidized region in the first portion contains proton with concentration higher than that in the oxidized region.

14. A method for manufacturing a vertical cavity surface emitting laser diode comprising:
   stacking an active layer and a plurality of layers to be oxidized containing Al on a principal face;
   forming a first recessed portion such that end faces of a first number of layers to be oxidized of the plurality of layers to be oxidized are exposed and a second recessed portion such that end faces of a second number of layers to be oxidized of the plurality of layers to be oxidized, the second number being different from the first number, the first and second recessed portions being arranged so as to be substantially orthogonal to each other; and
   advancing oxidation from the end faces of the layers to be oxidized which are exposed at the first and second recessed portions.

15. A method for manufacturing a vertical cavity surface emitting laser diode comprising:
   stacking an active layer and a semiconductor multi-layered reflecting mirror on a principal face of a substrate; and
   forming a first portion where proton is implanted on the semiconductor multi-layered reflecting mirror so as to surround a portion to be set as a light emitting region as viewed from the principal face and a second portion where proton is not implanted on the semiconductor multi-layered reflecting mirror, the first and second portions being arranged so as to be substantially orthogonal to each other; and
   advancing oxidation of at least one of semiconductor layers constituting the semiconductor multi-layered reflecting mirror from end faces of the first and second portions.

* * * * *

UNITED STATES PATENT AND TRADEMARK OFFICE
CERTIFICATE OF CORRECTION

| | | |
|---|---|---|
| PATENT NO. | : 7,244,629 B2 | Page 1 of 1 |
| APPLICATION NO. | : 10/978346 | |
| DATED | : July 17, 2007 | |
| INVENTOR(S) | : Ezaki et al. | |

It is certified that error appears in the above-identified patent and that said Letters Patent is hereby corrected as shown below:

On the title page, Item (30), the Foreign Application Priority Data has been omitted. Item (30) should read:
-- (30)     Foreign Application Priority Data
   Nov. 6, 2003  (JP).................................2003-377246 --

Signed and Sealed this

Eleventh Day of September, 2007

JON W. DUDAS
*Director of the United States Patent and Trademark Office*